(12) United States Patent
Lee

(10) Patent No.: US 12,089,442 B2
(45) Date of Patent: Sep. 10, 2024

(54) DISPLAY DEVICE

(71) Applicant: Samsung Display Co., LTD., Yongin-si (KR)

(72) Inventor: Daegeun Lee, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 396 days.

(21) Appl. No.: 17/505,571

(22) Filed: Oct. 19, 2021

(65) Prior Publication Data

US 2022/0231092 A1 Jul. 21, 2022

(30) Foreign Application Priority Data

Jan. 18, 2021 (KR) .................. 10-2021-0006829

(51) Int. Cl.
*H10K 59/121* (2023.01)
*H10K 50/84* (2023.01)
*H10K 59/40* (2023.01)

(52) U.S. Cl.
CPC .......... *H10K 59/121* (2023.02); *H10K 50/84* (2023.02); *H10K 59/40* (2023.02)

(58) Field of Classification Search
CPC ...... H10K 59/121; H10K 50/84; H10K 59/40; H10K 59/1201; H10K 59/131; H10K 59/12; H10K 50/844; H10K 59/1213; G06F 3/0412; H01L 27/124
See application file for complete search history.

(56) References Cited

U.S. PATENT DOCUMENTS

| 7,760,276 | B2 | 7/2010 | Ahn et al. |
| 9,219,244 | B2 | 12/2015 | Lee |
| 9,591,754 | B2 | 3/2017 | Lee |
| 9,929,226 | B2 | 3/2018 | Im et al. |
| 10,109,700 | B2 | 10/2018 | Jang et al. |
| 10,566,395 | B2 | 2/2020 | Lee et al. |
| 10,886,348 | B2 | 1/2021 | Kim et al. |
| 11,099,438 | B2 | 8/2021 | Shiina |
| 2009/0026462 | A1 | 1/2009 | Hashiguchi |
| 2016/0197097 | A1 | 7/2016 | Kim |
| 2017/0062548 | A1* | 3/2017 | Han ................ H10K 50/824 |

FOREIGN PATENT DOCUMENTS

| JP | 2019-0191460 | 10/2019 |
| KR | 10-2006-0079035 | 7/2006 |
| KR | 10-2009-0010900 | 1/2009 |

(Continued)

*Primary Examiner* — Kyoung Lee
(74) *Attorney, Agent, or Firm* — CANTOR COLBURN LLP

(57) ABSTRACT

A display device includes a substrate including a display area and a pad area, a pixel structure disposed on the display area, a pixel insulating layer disposed on the pad area and having a first opening, and a pad electrode structure including a signal electrode disposed in the first opening, a connection electrode disposed on the signal electrode, and a pad electrode disposed on the connection electrode. An upper surface and a side surface of the signal electrode come into direct-contact with a lower surface of the connection electrode. An upper surface and a side surface of the connection electrode come into direct-contact with a lower surface of the pad electrode.

19 Claims, 15 Drawing Sheets

(56) References Cited

FOREIGN PATENT DOCUMENTS

| | | |
|---|---|---|
| KR | 10-2014-0020565 | 2/2014 |
| KR | 10-2016-0014259 | 2/2016 |
| KR | 10-2016-0083993 | 7/2016 |
| KR | 10-2016-0141317 | 12/2016 |
| KR | 10-2017-0038406 | 4/2017 |
| KR | 10-1725896 | 4/2017 |
| KR | 10-1879180 | 7/2018 |
| KR | 10-2018-0133706 | 12/2018 |
| KR | 10-2019-0130091 | 11/2019 |

\* cited by examiner

FIG. 11
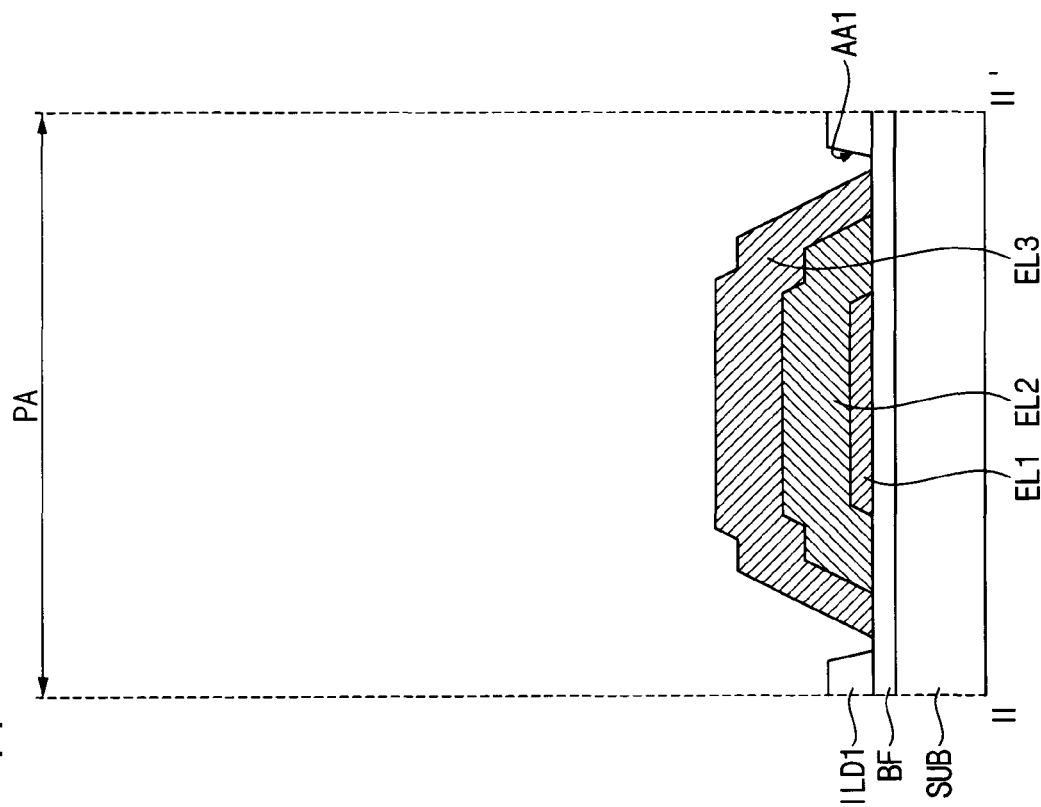
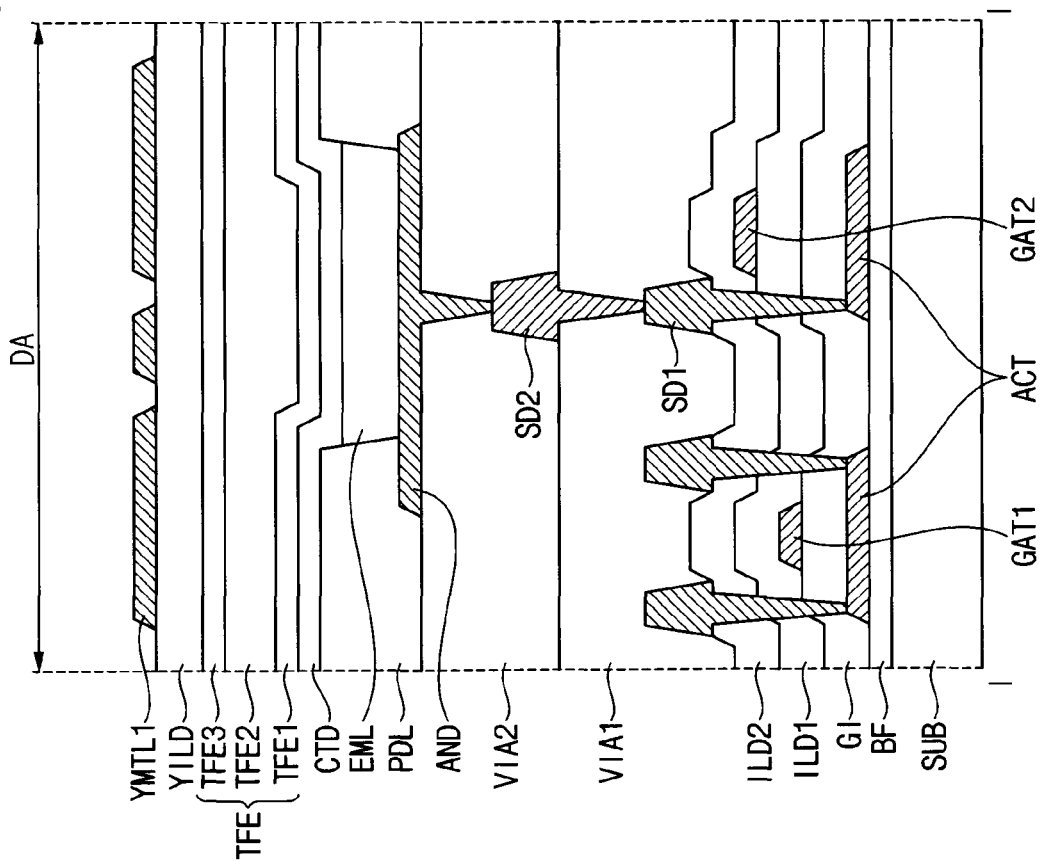

FIG. 13
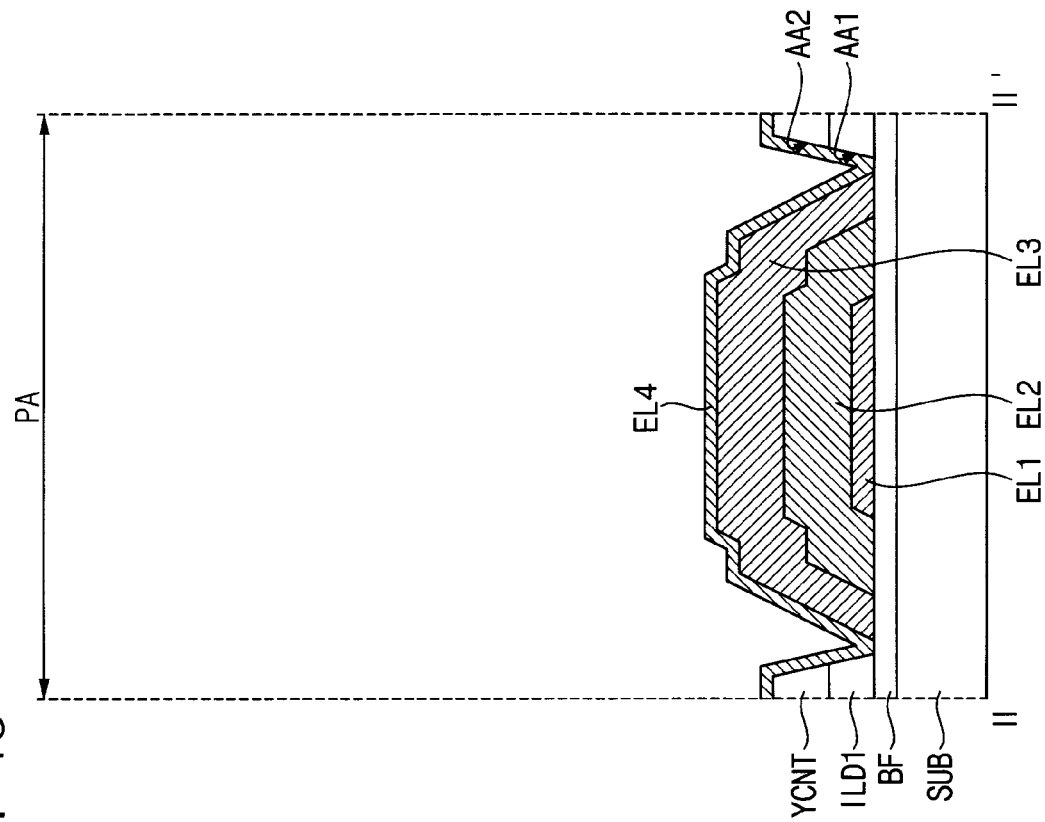
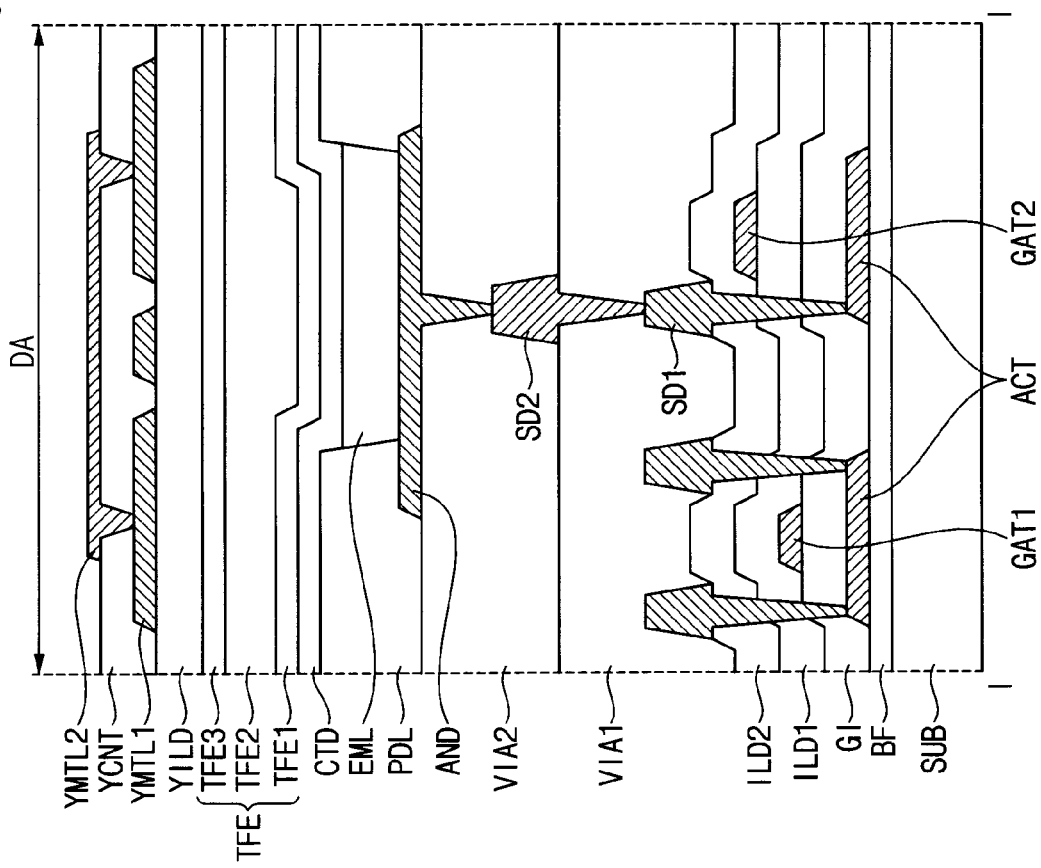

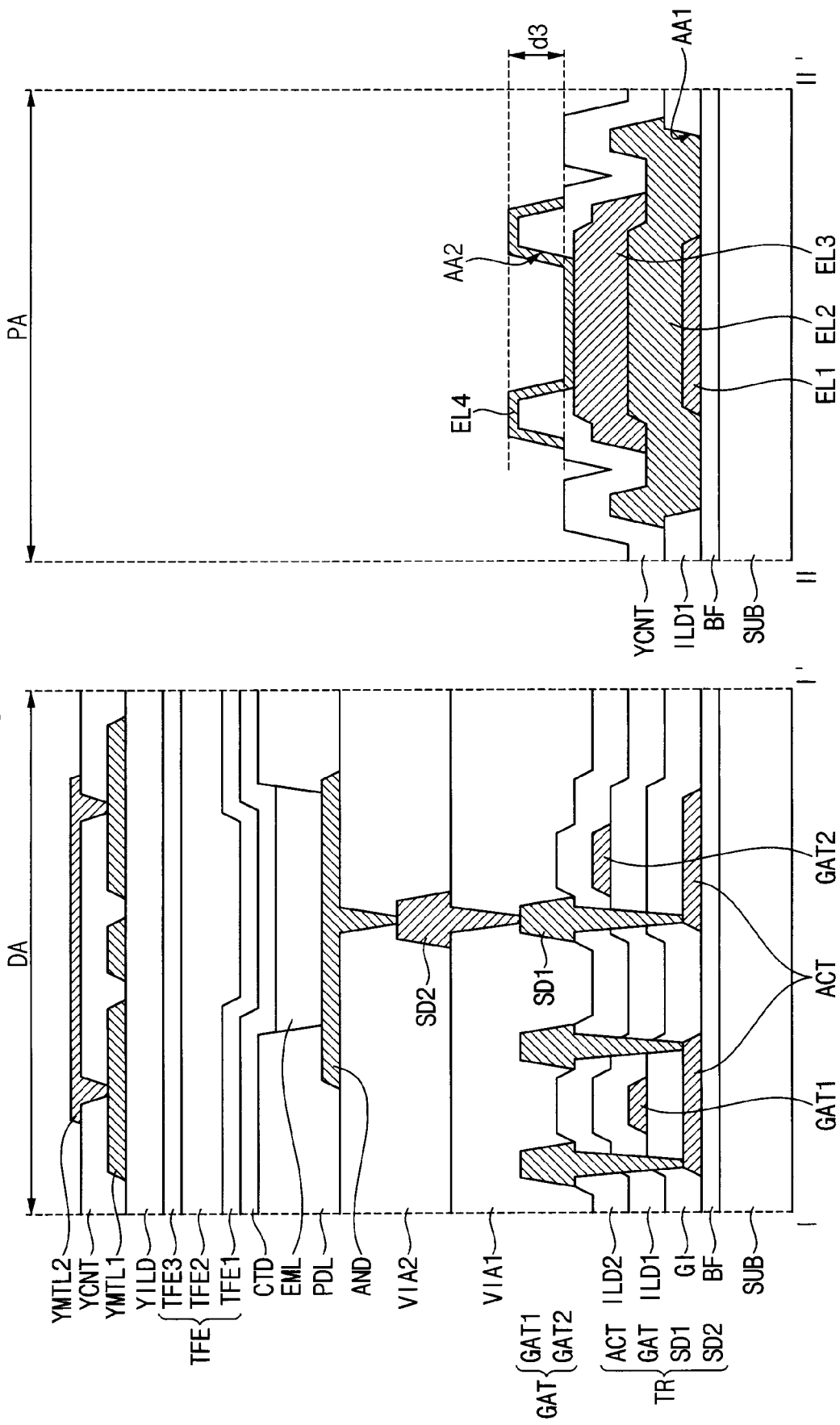

DISPLAY DEVICE

CROSS REFERENCE TO RELATED APPLICATIONS

This application claims priority from and the benefit of Korean Patent Application No. 10-2021-0006829, filed on Jan. 18, 2021, which is hereby incorporated by reference for all purposes as if fully set forth herein.

BACKGROUND

Field

Embodiments of the invention relate generally to a display device. More specifically, the invention relates to a display device including a pad area.

Discussion of the Background

Display devices used in computer monitors, TVs, and mobile phones include an organic light emitting display device that emits light by itself and a liquid crystal display device that requires a separate light source.

A pad electrode structure electrically connected to an external device may be disposed in a pad area of the display device. The pad electrode structure may have a structure in which metal layers are stacked. In order to prevent corrosion that may occur on each side of the metal layers, each side of the metal layers may be covered with an organic insulating layer or an inorganic insulating layer. Due to the organic insulating layer or the inorganic insulating layer, a step difference of an upper surface of the pad electrode structure may increase. Accordingly, there is a problem that the metal layers are not electrically connected to the external device.

The above information disclosed in this Background section is only for understanding of the background of the inventive concepts, and, therefore, it may contain information that does not constitute prior art.

SUMMARY

Devices constructed according to illustrative implementations of the invention are capable of reducing an amount of corrosion from forming on a display device.

Some embodiments provide a display device with an improved pad area.

Additional features of the inventive concepts will be set forth in the description which follows, and in part will be apparent from the description, or may be learned by practice of the inventive concepts.

A display device according to an embodiment may include a substrate including a display area and a pad area, a pixel structure disposed on the display area in the substrate, a pixel insulating layer disposed on the pad area and having a first opening, and a pad electrode structure including a signal electrode disposed in the first opening, a connection electrode disposed on the signal electrode, and a pad electrode disposed on the connection electrode. An upper surface and a side surface of the signal electrode may come into direct-contact with a lower surface of the connection electrode. An upper surface and a side surface of the connection electrode may come into direct-contact with a lower surface of the pad electrode.

The pixel insulating layer may be spaced apart from the signal electrode, the connection electrode, and the pad electrode.

The connection electrode may completely cover the upper surface and the side surface of the signal electrode.

The pad electrode may completely cover the upper surface and the side surface of the connection electrode.

The display device may further include a transistor disposed on the display area between the substrate and the pixel structure. The transistor may include an active pattern, a gate electrode disposed on the active pattern, a first electrode disposed on the gate electrode, and a second electrode disposed on the first electrode.

The signal electrode may include a material identical to a material of the gate electrode.

The connection electrode may include a material identical to a material of the first electrode.

The pad electrode may include a material identical to a material of the second electrode.

The pixel insulating layer may include a gate insulating layer that covers the active pattern in the display area and has an opening in the pad area, and an interlayer insulating layer that covers the gate electrode in the display area and has an opening overlapping the opening of the gate insulating layer in the pad area. The opening of the gate insulating layer and the opening of the interlayer insulating layer may be defined as a first opening of the pixel insulating layer.

The display device may include an encapsulation layer disposed on the display area in the pixel structure, and a touch structure disposed on the encapsulation layer. The touch structure may include a touch electrode, a touch insulating layer disposed on the touch electrode, extending from the display area to the pad area on the encapsulation layer, and having a second opening overlapping the first opening in the pad area, and a connection conductive layer disposed on the display area in the touch insulating layer.

The touch insulating layer may be spaced apart from the signal electrode, the connection electrode, and the pad electrode.

The display device may include a cover electrode disposed on the pad electrode. An upper surface and a side surface of the pad electrode may come into direct-contact with a lower surface of the cover electrode.

The cover electrode may completely cover the upper surface and the side surface of the pad electrode.

The cover electrode may include a material identical to a material of the connection conductive layer.

A display device according to an embodiment may include a substrate including a display area and a pad area, a first gate electrode disposed on the substrate in the display area, a first insulating layer covering the first gate electrode, a second gate electrode disposed on the first insulating layer, a second insulating layer covering the second gate electrode, a first electrode disposed on the second insulating layer, a second electrode disposed on the first electrode, a pixel structure disposed on the second electrode, an encapsulation layer disposed on the pixel structure, a first touch insulating layer covering the encapsulation layer, a touch electrode disposed on the first touch insulating layer, a second touch insulating layer covering the touch electrode, a connection conductive layer disposed on the second touch insulating layer and coming into contact with the touch electrode, a signal electrode disposed on the substrate in the pad area, a connection electrode directly disposed on the signal electrode, a pad electrode directly disposed on the connection electrode, and a cover electrode directly disposed on the pad electrode.

At least one of the first insulating layer and the second insulating layer may extend from the display area to the pad area and may have a first opening in the pad area, and the signal electrode may be disposed in the first opening.

At least one of the first touch insulating layer and the second touch insulating layer may extend from the display area to the pad area and may have a second opening overlapping the first opening in the pad area.

At least one of the first insulating layer and the second insulating layer, which has the first opening, may be spaced apart from the signal electrode, the connection electrode, and the pad electrode.

At least one of the first touch insulating layer and the second touch insulating layer, which has the second opening, may be spaced apart from the signal electrode, the connection electrode, and the pad electrode.

The signal electrode may include a material identical to a material of the first gate electrode or the second gate electrode. The connection electrode may include a material identical to a material of the first electrode. The pad electrode may include a material identical to a material of the second electrode. The cover electrode may include a material identical to a material of the connection conductive layer, and may cover the second opening.

The insulating layers disposed on the pad area of the display device according to embodiments of the invention may be spaced apart from the signal electrode, the connection electrode, and the pad electrode. In other words, the insulating layers may not cover the signal electrode, the connection electrode, and the pad electrode. Accordingly, a step difference of the upper surface of the pad electrode structure including the signal electrode, the connection electrode, and the pad electrode can be minimized. Therefore, contact characteristics of a conductive ball electrically connected to the pad electrode structure can be improved.

In addition, the cover electrode may cover the pad electrode, the pad electrode may cover the connection electrode, and the connection electrode may cover the signal electrode. Accordingly, the signal electrode, the connection electrode, and the pad electrode can be prevented from being corroded.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 3, 4, 5, 6, 7, 8, 9, 10, 11, 12, and 13 are diagrams illustrating a method of manufacturing a display device according to an embodiment.

FIG. 15 is a cross-sectional view illustrating a display device according to an embodiment.

DETAILED DESCRIPTION

Figure 1:
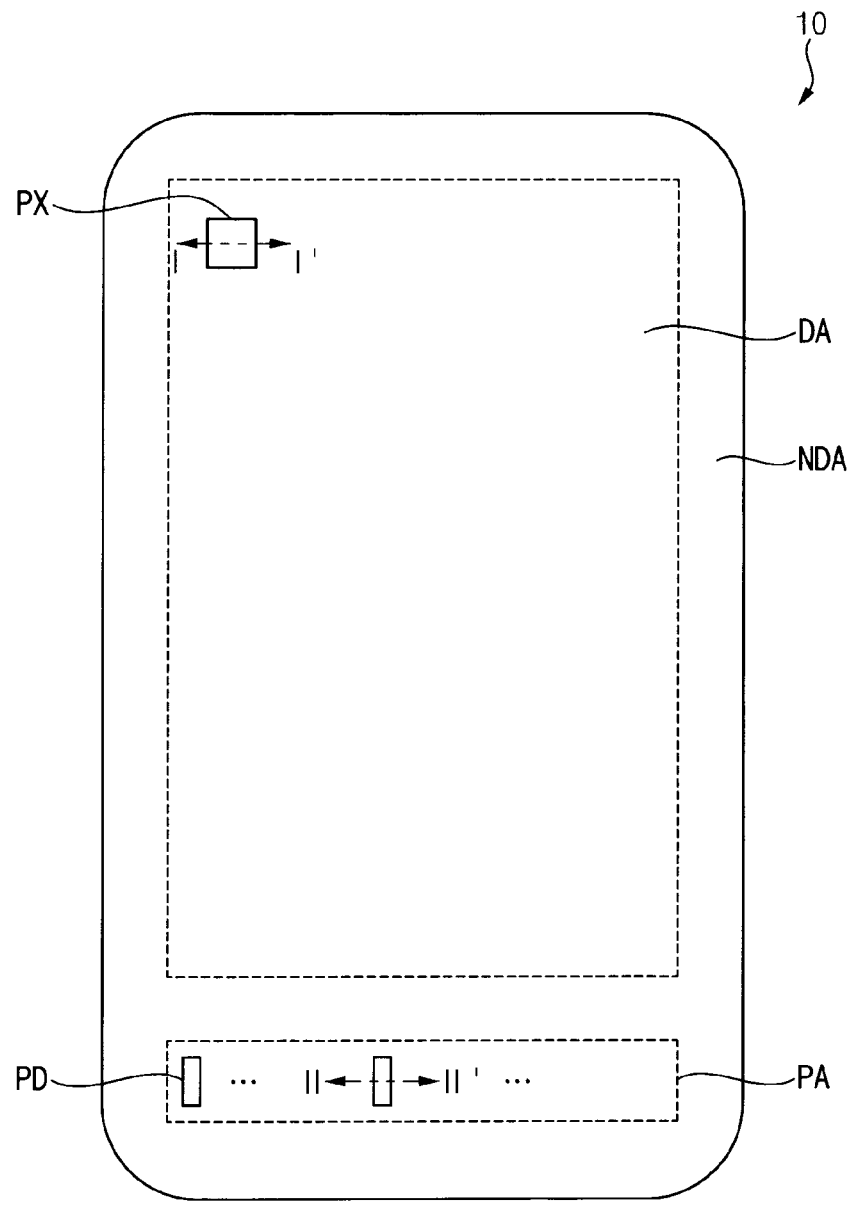
FIG. 1 is a plan view illustrating a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or io layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, is Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Illustrative, non-limiting embodiments will be more clearly understood from the following detailed description in conjunction with the accompanying drawings.

FIG. 1 is a plan view illustrating a display device 10 according to an embodiment that is constructed according to principles of the invention.

Referring to FIG. 1, the display device 10 according to an embodiment may include a display area DA and a non-display area NDA. The non-display area NDA may include a pad area PA. The pad area PA may be spaced apart from the display area DA.

In one embodiment, a plurality of pixels PX may be disposed on the display area DA. The plurality of pixels PX may be arranged in a form of a matrix over the whole display area DA. However, this is an illustrative purpose only, and the plurality of pixels PX may be arranged in various forms on the display area DA. The display device 10 may display an image on the display area DA through the plurality of pixels PX. The display device 10 may be an organic light emitting display device. However, this is an illustrative purpose only, and the display device 10 may be a liquid crystal display device, an electrophoretic display device, a plasma display device, or the like.

Drivers (for example, a gate driver and/or a data driver) may be disposed on the non-display area NDA. Various electronic devices such as an integrated circuit or a printed circuit board may be electrically connected to the pad area PA of the non-display area NDA. The non-display area NDA may be disposed to surround the display area DA when viewed in a plan view.

A plurality of pads PD may be disposed in the pad area PA. The plurality of pads PD may electrically connect the display device 10 and the drivers.

Figure 2:
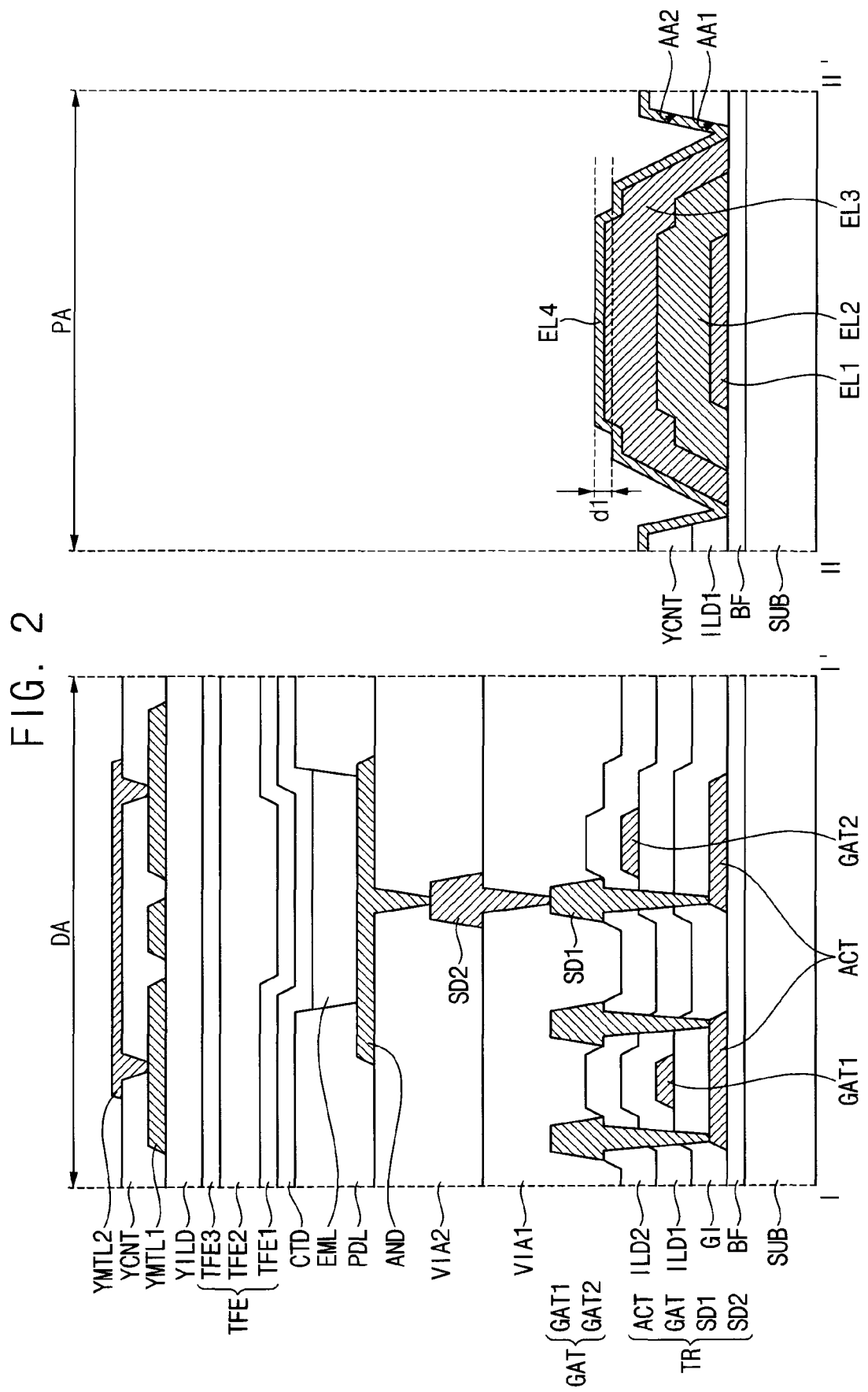
FIG. 2 is a cross-sectional view taken along lines I-I' and II-II' of FIG. 1.

FIG. 2 is a cross-sectional view taken along lines I-I' and II-IF of FIG. 1.

Referring to FIG. 2, the cross-section on the left is a cross-section taken along line I-I' of FIG. 1 and may be a cross-section of each of the plurality of pixels PX. The cross-section on the right is a cross-section taken along line II-II' of FIG. 1 and may be a cross-section of each of the plurality of pads PD. The left cross-section may illustrate the display area DA and the right cross-section may illustrate the pad area PA.

Each of the plurality of pixels PX may include a substrate SUB, a transistor, a pixel structure, an encapsulation layer TFE, and a touch structure.

In one embodiment, the substrate SUB may be a glass substrate, a quartz substrate, a plastic substrate, or the like. When the substrate SUB is the plastic substrate, the substrate SUB may include various materials having flexible, foldable, bendable, or rollable properties. The substrate SUB may include a polymer resin. Examples of the polymer resin may include polyethersulphone (PES), polyacrylate (PAR), polyetherimide (PEI), polyethylene naphthalate (PEN), polyethyleneterephthalate (PET), polyphenylene sulfide (PPS), polyarylate (PAR), polyimide (PI), polycarbonate (PC), and cellulose acetate propionate (CAP). These may be used alone or in combination with each other. However, the polymer resin is not limited thereto. The substrate SUB may have a multilayer structure consisting of two layers including the polymer resin and a barrier layer including an inorganic material interposed between the two layers. The substrate SUB may have a single layer structure or a multilayer structure. Examples of the inorganic material may include silicon oxide ($SiO_x$), silicon nitride ($SiN_x$), and silicon oxynitride ($SiO_xN_y$). These may be used alone or in combination with each other. However, the inorganic material is not limited thereto.

A buffer layer BF may be disposed on the substrate SUB. The buffer layer BF may prevent metal atoms or impurities from diffusing from the substrate SUB to an active pattern ACT of a transistor TR. The active pattern ACT may be uniformly formed because the buffer layer BF controls the heat supply rate during the crystallization process for forming the active pattern ACT.

The transistor TR may include the active pattern ACT, a gate electrode GAT, a first electrode SD1, and a second electrode SD2. In an embodiment, the gate electrode GAT may include a first gate electrode GAT1 and a second gate electrode GAT2.

The active pattern ACT may be disposed on the buffer layer BF. In one embodiment, the active pattern ACT may include a silicon semiconductor. Examples of the silicon semiconductor may include amorphous silicon, polycrystalline silicon, or the like. In another embodiment, the active pattern ACT may include an oxide semiconductor. Examples of the oxide semiconductor may include zinc oxide, indium oxide, gallium oxide, tin oxide, titanium oxide, and phosphorus oxide. These may be used alone or in combination with each other. Specifically, the oxide semiconductor may include at least one selected from the group consisting of zinc-tin oxide, zinc-indium oxide, indium-gallium-zinc oxide, and indium-zinc-tin oxide.

A gate insulating layer GI may be disposed on the active pattern ACT. The gate insulating layer GI may insulate the active pattern ACT from the first gate electrode GAT1. The gate insulating layer GI may include an insulating material. Examples of the insulating material may include silicon oxide, silicon nitride, titanium oxide, tantalum oxide, or the like.

The first gate electrode GAT1 may be disposed on the gate insulating layer GI. A gate signal for applying an on/off signal to the transistor TR may be applied to the first gate electrode GAT1. The first gate electrode GAT1 may include metal, an alloy, conductive metal oxide, a transparent conductive material, or the like. For example, the first gate electrode GAT1 may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium-tin oxide, indium-zinc oxide, or the like.

A first insulating layer ILD1 may be disposed on the first gate electrode GAT1. The first insulating layer ILD1 may insulate the first gate electrode GAT1 from the first electrode SD1. The first insulating layer ILD1 may include an insulating material. Examples of the insulating material may include silicon oxide, silicon nitride, titanium oxide, tantalum oxide, or the like.

The second gate electrode GAT2 may be disposed on the first insulating layer ILD1. A gate signal for applying an on/off signal to the transistor TR may be applied to the second gate electrode GAT2. The second gate electrode GAT2 may include metal, an alloy, conductive metal oxide, a transparent conductive material, or the like. For example, the first gate electrode GAT1 may include silver, an alloy containing silver, molybdenum, an alloy containing molybdenum, aluminum, an alloy containing aluminum, aluminum nitride, tungsten, tungsten nitride, copper, nickel, chromium, chromium nitride, titanium, tantalum, platinum, scandium, indium-tin oxide, indium-zinc oxide, or the like.

A second insulating layer ILD2 may be disposed on the second gate electrode GAT2. The second insulating layer ILD2 may insulate the second gate electrode GAT2 from the first electrode SD1. The second insulating layer ILD2 may include an insulating material. Examples of the insulating material may include silicon oxide, silicon nitride, titanium oxide, tantalum oxide, or the like.

The first electrode SD1 may be disposed on the second insulating layer ILD2. When gate signals applied to the first gate electrode GAT1 and the second gate electrode GAT2 are turned on/off, the first electrode SD1 may transmit a signal to the second electrode SD2. The first electrode SD1 may come into contact with the active pattern ACT through a contact hole formed through the gate insulating layer GI, the first insulating layer ILD1, and the second insulating layer ILD2.

A first via insulating layer VIA1 may be disposed on the first electrode SD1. The first via insulating layer VIA1 may include an organic insulating material. Examples of the organic insulating material may include photoresist, a polyacrylic resin, a polyimide resin, an acrylic resin, or the like. The first via insulating layer VIA1 may be configured to have a substantially flat top surface. The "substantially flat" may be exactly flat, or may be flat within acceptable variations that may occur, for example, due to manufacturing processes.

The second electrode SD2 may be disposed on the first via insulating layer VIA1. The second electrode SD2 may receive a signal from the first electrode SD1 and may transmit the signal to a lower electrode layer AND. The second electrode SD2 may come into contact with the first electrode SD1 through a contact hole formed through the first via insulating layer VIA1.

A second via insulating layer VIA2 may be disposed on the second electrode SD2. The second via insulating layer VIA2 may include an organic insulating material. Examples of the organic insulating material may include photoresist, a polyacrylic resin, a polyimide resin, an acrylic resin, or the like. The second via insulating layer VIA2 may be configured to have a substantially flat top surface. The "substantially flat" may be exactly flat, or may be flat within acceptable variations that may occur, for example, due to manufacturing processes.

The pixel structure may include the lower electrode layer AND, a light emission layer EML, and an upper electrode layer CTD.

The lower electrode layer AND may be disposed on the second via insulating layer VIA2. The lower electrode layer AND may include a metal, an alloy, a conductive metal oxide, a transparent conductive material, or the like. The lower electrode layer AND may be connected to the second electrode SD2 by a contact hole formed through the second via insulating layer VIA2. In one embodiment, the lower electrode layer AND may be used as an anode electrode. In another embodiment, the lower electrode layer AND may be used as a cathode electrode.

A pixel defining layer PDL may be disposed on the lower electrode layer AND. The pixel defining layer PDL may partition an emission area of each of the plurality of pixels PX. The pixel defining layer PDL may be an organic insulating layer including an organic material. For example, the pixel defining layer PDL may include an organic insulating material such as a polyacryl-based compound, a polyimide-based compound, a fluorine-based carbon compound such as Teflon, and a benzocyclobutene compound. The pixel defining layer PDL may include an opening for exposing an upper surface of the lower electrode layer AND.

The light emission layer EML may be disposed on the lower electrode layer AND. The light emission layer EML may be provided as a single layer, or may be provided as a multilayer including various functional layers. For example, the light emission layer EML may have a single structure or a stacked structure of a hole injection layer, a hole transport layer, an emission layer, an electron transport layer, and an electron injection layer.

The upper electrode layer CTD may be disposed on the light emission layer EML. The upper electrode layer CTD may cover the pixel defining layer PDL on the light emission layer EML. In one embodiment, the upper electrode layer CTD may be used as a cathode electrode. In another embodiment, the upper electrode layer CTD may be used as an anode electrode.

The encapsulation layer TFE may be disposed on the upper electrode layer CTD. The encapsulation layer TFE may prevent penetration of external moisture and oxygen. The encapsulation layer TFE may include at least one inorganic layer and at least one organic layer. The at least one inorganic layer and the at least one organic layer may be alternately stacked with each other. For example, the encapsulation layer TFE may include a first inorganic layer TFE1, an organic layer TFE2 disposed on the first inorganic layer TFE1, and a second inorganic layer TFE3 disposed on the organic layer TFE2, but the embodiment is not limited thereto.

A touch structure may include a first touch insulating layer YILD, a touch electrode YMTL1, a second touch insulating layer YCNT, and a connection conductive layer YMTL2.

The first touch insulating layer YILD may be disposed on the encapsulation layer TFE. The first touch insulating layer YILD may include an organic insulating material or an inorganic insulating material. The touch electrode YMTL1 may be disposed on the first touch insulating layer YILD. The touch electrode YMTL1 may be a thin metal conductive layer. The second touch insulating layer YCNT may be disposed on the touch electrode YMTL1. The second touch insulating layer YCNT may include an organic insulating material or an inorganic insulating material. The connection conductive layer YMTL2 may be disposed on the second touch insulating layer YCNT. The connection conductive layer YMTL2 may be a thin metal conductive layer. The connection conductive layer YMTL2 may come into contact with the touch electrode YMTL1 through a contact hole formed through the second touch insulating layer YCNT.

Each of the pads PD may include a pad electrode structure. The pad electrode structure may include a signal electrode EL1, a connection electrode EL2, a pad electrode EL3, and a cover electrode EL4.

The pad electrode structure may be electrically connected to an external device. For example, the pad electrode structure may be electrically connected to a bump attached to a lower portion of a flexible printed circuit board (FPCB). An anisotropic conductive film (ACF) including at least one conductive ball may be disposed between the pad electrode structure and the bump to electrically connect the pad electrode structure and the bump. The pad electrode structure may be electrically connected to the bump through the conductive ball. However, in order to provide various functions to a display device 10, the pad electrode structure may include a plurality of electrodes. Several insulating layers may be included to prevent the electrodes from being corroded. Accordingly, a step difference may increase on the upper surface of the pad electrode structure. As the step difference increases on the upper surface of the pad electrode structure, a contact defect may occur between the conductive ball and the pad electrode structure or the conductive ball may not come into contact with the pad electrode structure. Therefore, there is a desire to provide a method for minimizing the step difference on the upper surface of the pad electrode structure while preventing the electrodes included in the pad electrode structure from being corroded.

The first insulating layer ILD1 may extend from the display area DA to the pad area PA, and may have a first opening AA1 in the pad area PA. However, this is for illustrative purposes only, and at least one of the gate insulating layer GI, the first insulating layer ILD1, and the second insulating layer ILD2 may extend from the display area DA to the pad area PA, and the pad area PA may have the first opening AA1 in the pad area PA. In addition, when at least two of the gate insulating layer GI, the first insulating layer ILD1, and the second insulating layer ILD2 extend from the display area DA to the pad area PA and the pad area PA has openings, the openings may overlap each other to define the first opening AA1.

The signal electrode EL1 may be disposed in the first opening AA1 on the substrate SUB. The first insulating layer ILD1 having the first opening AA1 may be disposed as being spaced apart from the signal electrode EL1. The first insulating layer ILD1 having the first opening AA1 may not come into contact with the signal electrode EL1 and may not cover the signal electrode EL1. The signal electrode EL1 may include the same material as at least one of the first electrode GAT1 and the second gate electrode GAT2.

The connection electrode EL2 may be disposed on the signal electrode EL1. The connection electrode EL2 may be directly disposed on the signal electrode EL1. An insulating layer may not be disposed between the connection electrode EL2 and the signal electrode EL1. The connection electrode EL2 may not be electrically connected to the signal electrode EL1 through a contact hole, and a lower surface of the connection electrode EL2 may directly contact with an upper surface and a side surface of the signal electrode EL1. The connection electrode EL2 and the signal electrode EL1 may be electrically connected to each other. The connection electrode EL2 may completely cover the upper surface and the side surface of the signal electrode EL1. Not only the connection electrode EL2 may cover the signal electrode EL1 when viewed in a sectional view, but also may completely cover the signal electrode EL1 when viewed in a plan view. The connection electrode EL2 may include the same material as a first electrode SD1.

The first insulating layer ILD1 having the first opening AA1 may be disposed as being spaced apart from the connection electrode EL2. The first insulating layer ILD1 having the first opening AA1 may not come into contact with the connection electrode EL2, and may not cover the connection electrode EL2.

The pad electrode EL3 may be disposed on the connection electrode EL2. The pad electrode EL3 may be directly disposed on the connection electrode EL2. An insulating layer may not be disposed between the pad electrode EL3 and the connection electrode EL2. The pad electrode EL3 may not be electrically connected to the connection electrode EL2 through a contact hole, and the lower surface of the pad electrode EL3 may directly make contact with the upper surface and the side surface of the connection electrode EL2. The pad electrode EL3 and the connection electrode EL2 may be electrically connected to each other. The pad electrode EL3 may completely cover the upper surface and the side surface of the connection electrode EL2. Not only the pad electrode EL3 may cover the connection electrode EL2 when viewed in a sectional view, but also the pad electrode EL3 may completely cover the connection electrode EL2 when viewed in a plan view. The pad electrode EL3 may include the same material as the second electrode SD2.

The first insulating layer ILD1 having the first opening AA1 may be disposed as being spaced apart from the pad electrode EL3. The first insulating layer ILD1 having the first opening AA1 may not come into contact with the pad electrode EL3, and may not cover the pad electrode EL3.

The second touch insulating layer YCNT may extend from the display area DA to the pad area PA and may have a second opening AA2 overlapping the first opening AA1 in the pad area PA. However, this is for illustrative purpose only, and at least one of the first touch insulating layer YILD and the second touch insulating layer YCNT may extend from the display area DA to the pad area PA, and may have a second opening AA2 overlapping the first opening AA1 in the pad area PA. When the first and second touch insulating layers YILD and YCNT extend from the display area DA to the pad area PA and have openings in the pad area PA, the openings may overlap each other to define the second opening AA2 overlapping the first opening AA1.

The second touch insulating layer YCNT having the second opening AA2 may be disposed as being spaced apart from the signal electrode EL1, the connection electrode EL2, and the pad electrode EL3. The second touch insulating layer YCNT having the second opening AA2 may not make contact with the signal electrode EL1, the connection electrode EL2, and the pad electrode EL3, and may not cover the signal electrode EL1, the connection electrode EL2, and the pad electrode EL3.

The cover electrode EL4 may be disposed on the pad electrode EL3. The cover electrode EL4 may be directly disposed on the pad electrode EL3. An insulating layer may not be disposed between the cover electrode EL4 and the pad electrode EL3. The cover electrode EL4 may not be electrically connected to the pad electrode EL3 through a contact hole, and the lower surface of the cover electrode EL4 may directly make contact with the upper surface and the side surface of the pad electrode EL3. The cover electrode EL4 and the pad electrode EL3 may be electrically connected to each other. The cover electrode EL4 may completely cover the upper surface and the side surface of the pad electrode EL3. Not only the cover electrode EL4 may cover the pad electrode EL3 when viewed in a sectional view, but also may completely cover the pad electrode EL3 when viewed in a plan view. The cover electrode EL4 may include the same material as the connection conductive layer YMTL2.

Since the upper surface and the side surface of the signal electrode EL1 come into direct-contact with the lower surface of the connection electrode EL2, the upper surface and the side surface of the connection electrode EL2 come into direct-contact with the lower surface of the pad electrode EL3, and the upper surface and the side surface of the pad electrode EL3 come into direct-contact with the lower surface of the cover electrode EL4, a step different dl of each pad PD disposed on the pad area PA may be minimized. The gate insulating layer GI, the first insulating layer ILD1, the second insulating layer ILD2, the first touch insulating layer YILD, and the second touch insulating layer YCNT may be disposed as being spaced apart from the signal electrodes EL1, the connection electrode EL2, and the pad electrode EL3, so that the step difference d1 of each pad PD disposed on the pad area PA may be minimized. Since the signal electrode EL1, the connection electrode EL2, and the pad electrode EL3 may not be covered with any insulating layer, the step difference dl of each pad PD disposed on the pad area PA may be minimized. Since the step difference dl of each pad PD disposed on the pad area PA can be minimized, a contact characteristic with respect to the conductive ball may be improved.

Although the signal electrode EL1, the connection electrode EL2, and the pad electrode EL3 are not covered with any insulating layer, the cover electrode EL4 may cover the pad electrode EL3, the pad electrode EL3 may cover the connection electrode EL2, and the connection electrode EL2 may cover the signal electrode EL1, so that the signal electrode EL1, the connection electrode EL2, and the pad electrode EL3 may be prevented from being corroded.

The contact characteristics with respect to the conductive ball may be improved by minimizing the step difference of each pad PD disposed on the pad area PA while preventing the electrodes included in each pad PD from being corroded.

FIGS. 3, 4, 5, 6, 7, 8, 9, 10, 11, 12, and 13 are diagrams illustrating a method of manufacturing a display device 10 according to an embodiment.

Figure 3:
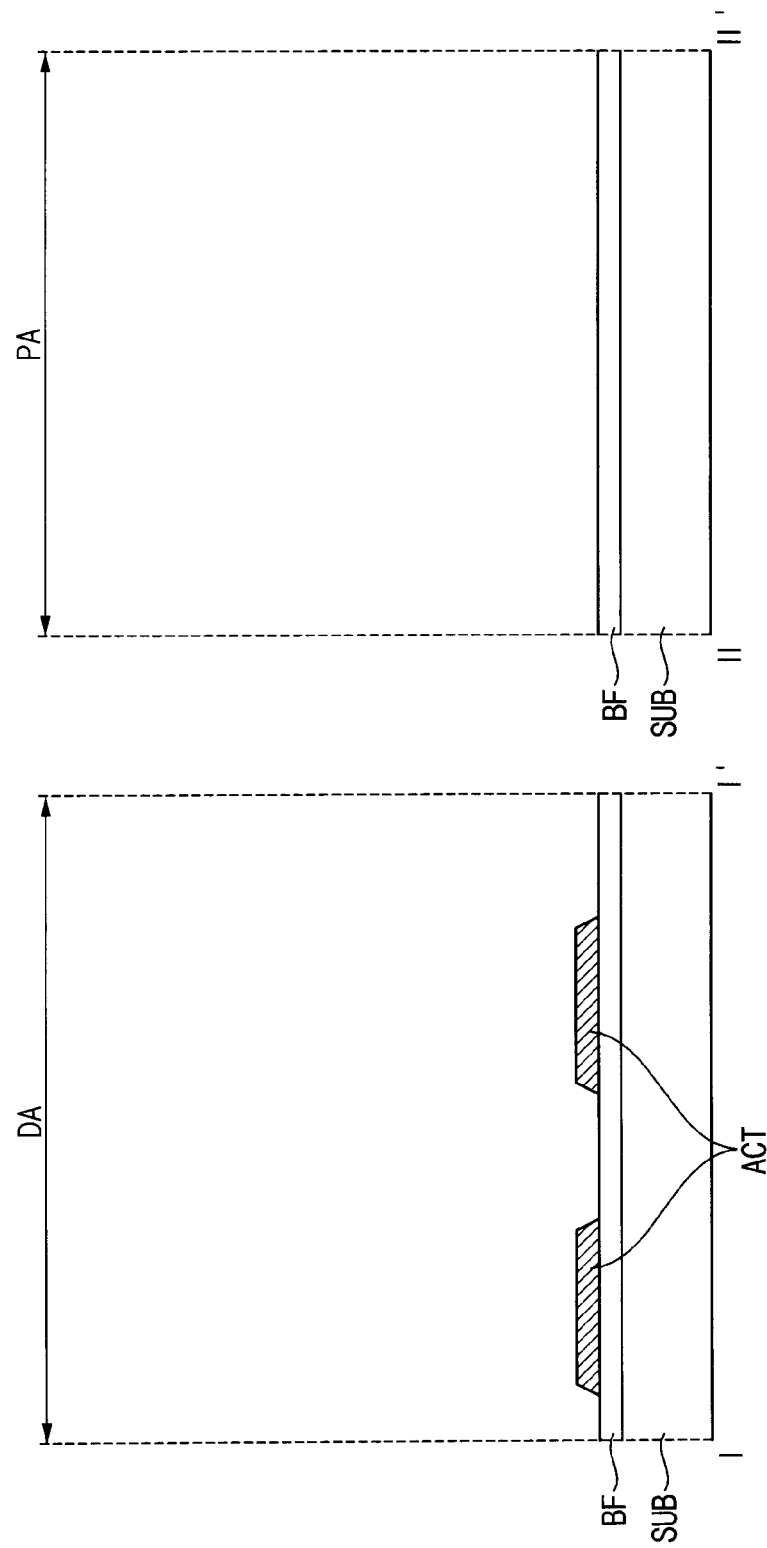

Referring to FIG. 3, the method of manufacturing the display device 10 according to one embodiment of the invention may include forming the buffer layer BF on the substrate SUB. The buffer layer BF may be formed to overlap both the display area DA and the pad area PA.

Then, the method of manufacturing the display device 10 may include forming the active pattern ACT. The active pattern ACT may be formed to overlap only the display area DA, and may be disposed on the buffer layer BF.

Figure 4:
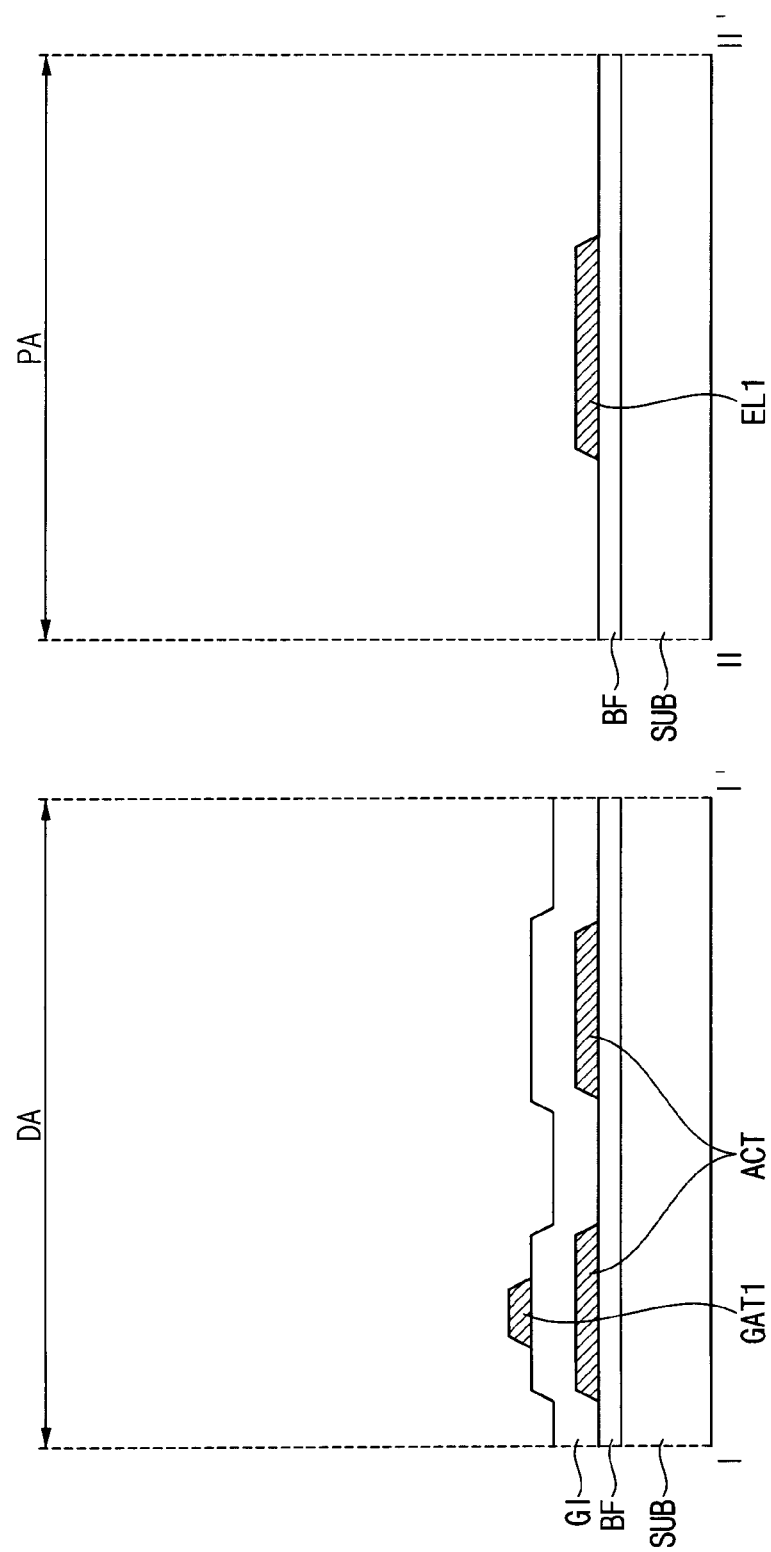

Referring to FIG. 4, the method of manufacturing the display device 10 may include forming the gate insulating layer GI. The gate insulating layer GI may be disposed on the active pattern ACT in the display area DA.

Then, the method of manufacturing the display device 10 may include forming the first gate electrode GAT1 and the signal electrode EL1. The first gate electrode GAT1 may be disposed on the gate insulating layer GI in the display area DA, and the signal electrode EL1 may be disposed on the buffer layer BF in the pad area PA. The first gate electrode GAT1 and the signal electrode EL1 may be simultaneously formed and may include the same material.

Figure 5:
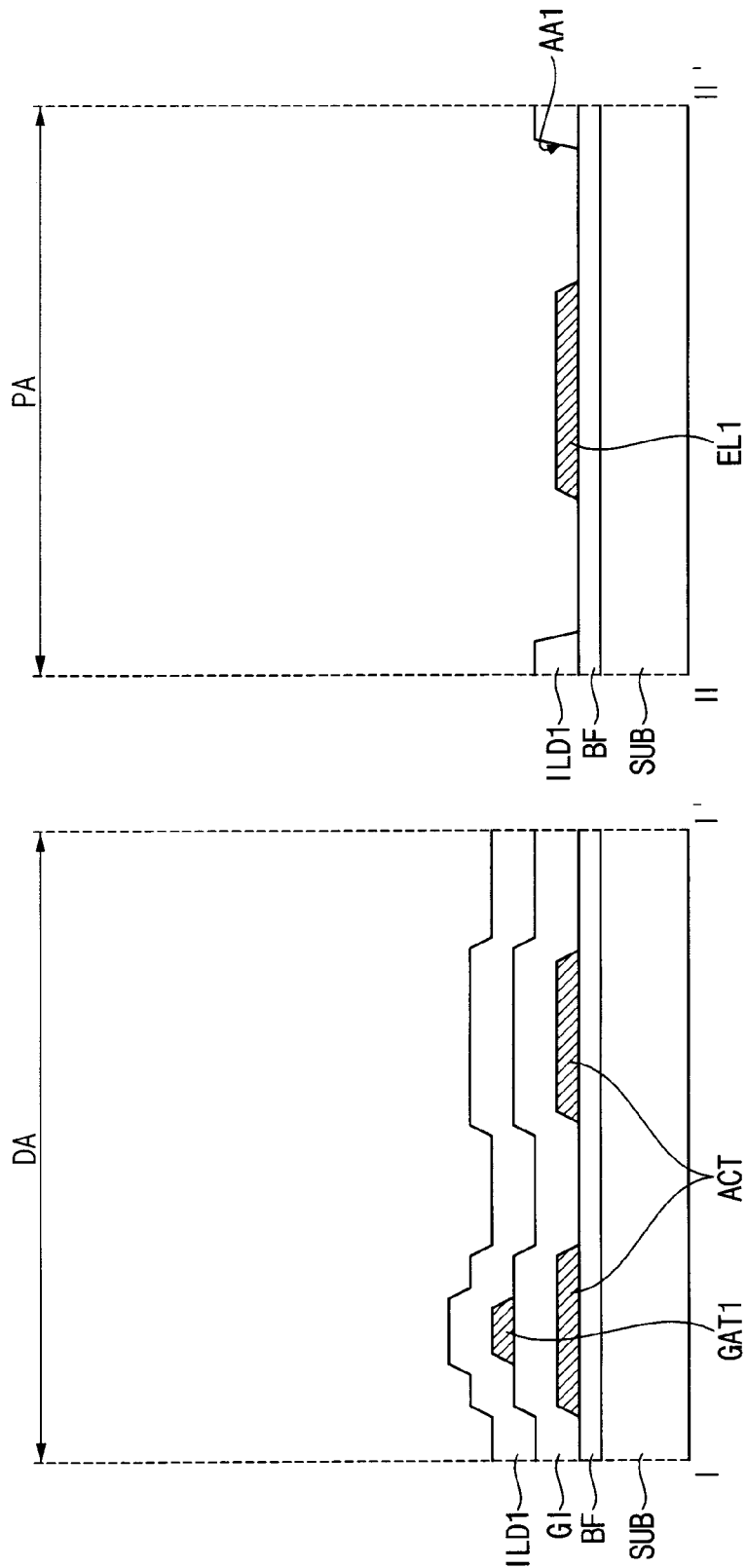

Referring to FIG. 5, the method of manufacturing the display device 10 may include forming the first insulating layer ILD1. The first insulating layer ILD1 may be disposed on the first gate electrode GAT1 in the display area DA and may extend from the display area DA to the pad area PA. The first insulating layer ILD1 may be configured to have the first opening AA1 in the pad area PA. Although the insulating layer having the first opening AA1 is illustrated as the first insulating layer ILD1, the insulating layer having the first opening AA1 may be the gate insulating layer GI. In other words, the gate insulating layer GI may extend from the display area DA to the pad area PA, and may have the first opening AA1 in the pad area PA.

Figure 6:
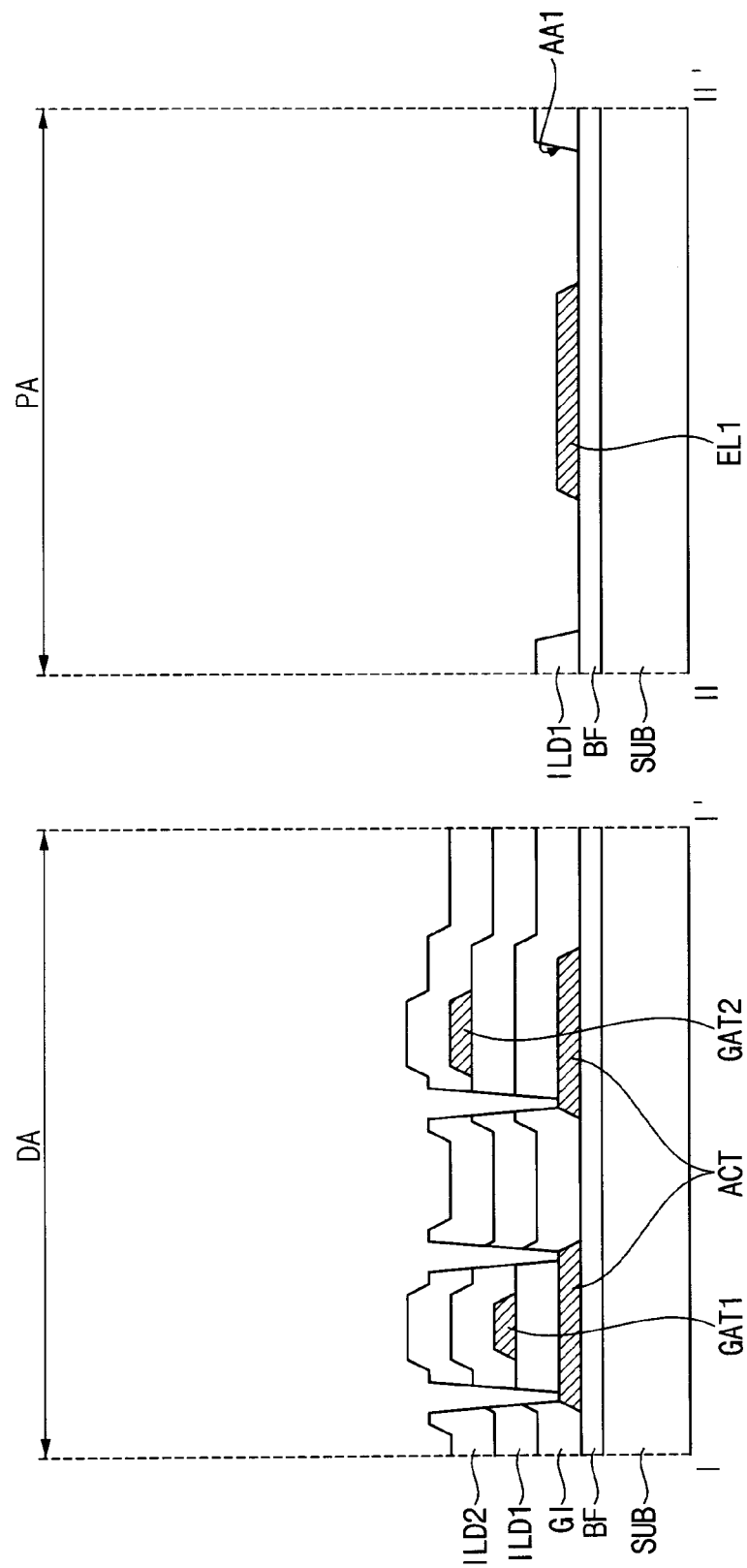

Referring to FIG. 6, the method of manufacturing the display device 10 may include forming the second gate electrode GAT2. The second gate electrode GAT2 may be disposed on the first insulating layer ILD1 in the display area DA.

Then, the method of manufacturing the display device 10 may include forming the second insulating layer ILD2. The second insulating layer ILD2 may be disposed on the first insulating layer ILD1 in the display area DA. Although the insulating layer having the first opening AA1 is illustrated as the first insulating layer ILD1, the insulating layer having the first opening AA1 may be the second insulating layer ILD2. In other words, the second insulating layer ILD2 may extend from the display area DA to the pad area PA, and may have the first opening AA1 in the pad area PA.

Then, the method of manufacturing the display device 10 may include forming a contact hole which is formed through the second insulating layer ILD2, the first insulating layer ILD1, and the gate insulating layer GI to expose the active pattern ACT. The forming of the contact hole may expose the second gate electrode GAT2 through the second insulating layer ILD2, or expose the first gate electrode GAT1 through the second insulating layer ILD2 and the first insulating layer ILD1.

Figure 7:
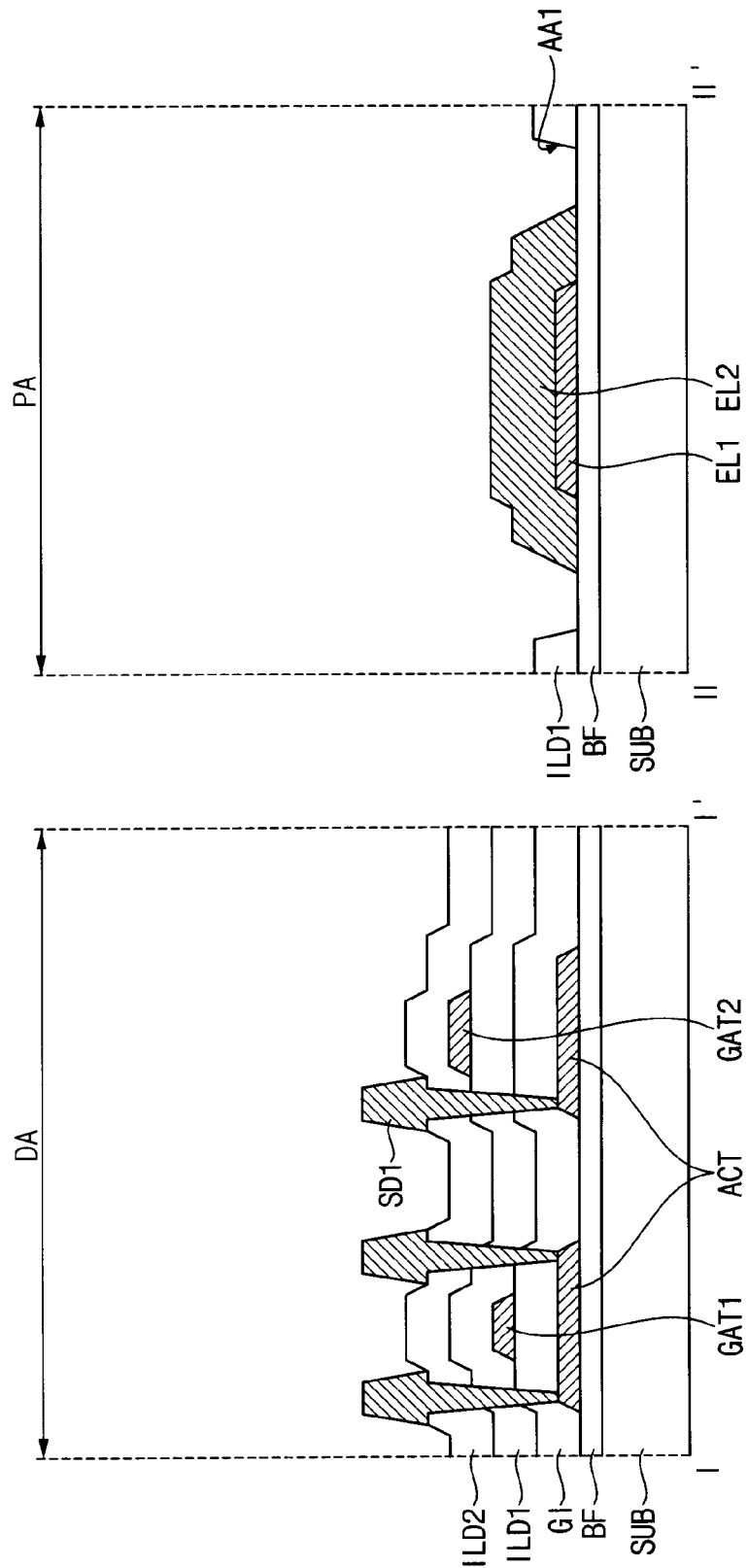

Referring to FIG. 7, the method of manufacturing the display device 10 may include forming the first electrode SD1 and the connection electrode EL2. The first electrode SD1 may be formed in the contact hole in the display area DA and disposed on the second insulating layer ILD2 to make contact with the active pattern ACT through the contact hole. The connection electrode EL2 may be disposed on the signal electrode EL1 in the pad area PA. The first electrode SD1 and the connection electrode EL2 may be simultaneously formed and may include the same material.

Figure 8:
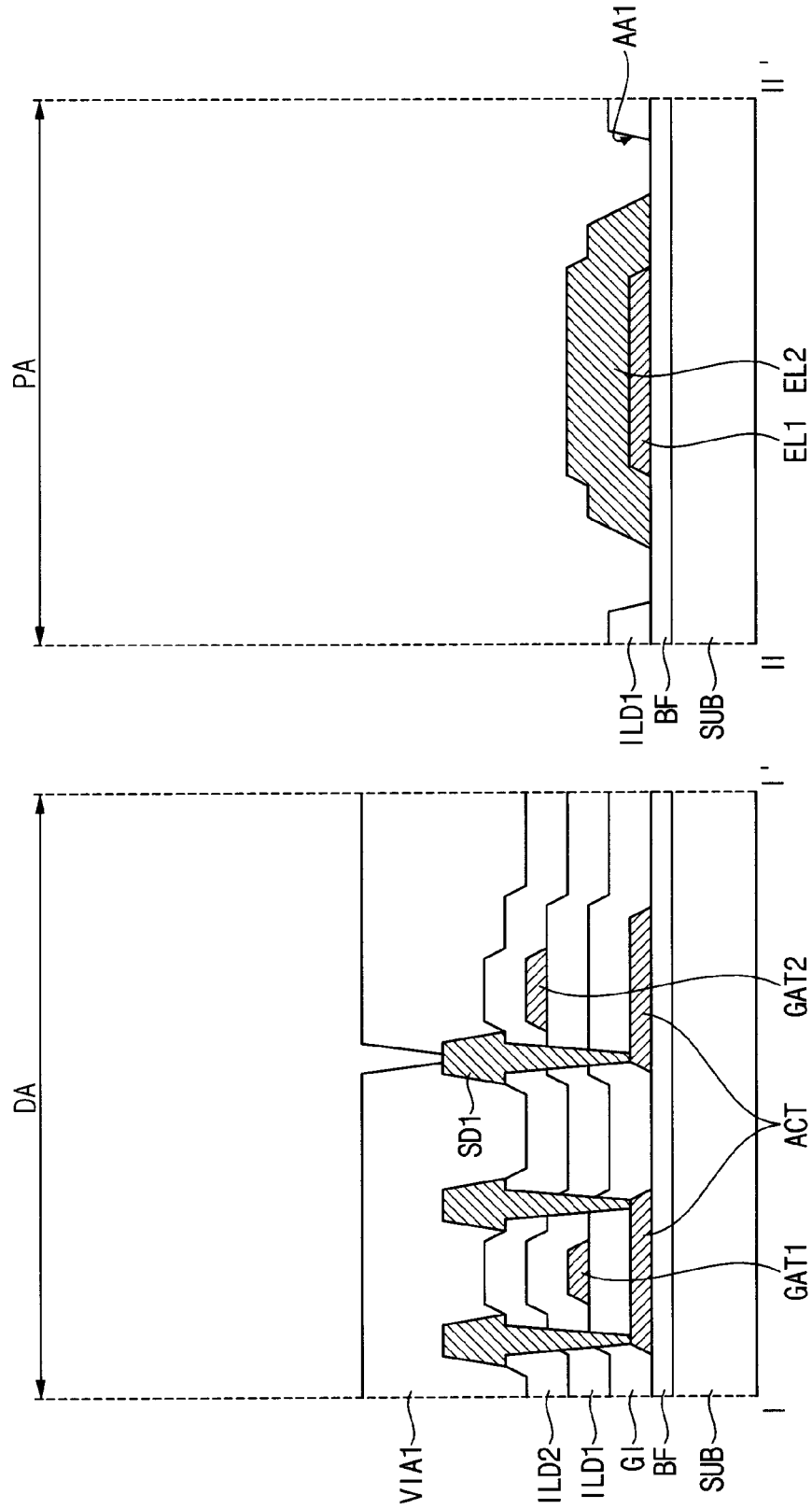

Referring to FIG. 8, the method of manufacturing the display device 10 may include forming the first via insulating layer VIA1. The first via insulating layer VIA1 may be disposed on the first electrode SD1 in the display area DA and may have a substantially flat upper surface.

Then, the method may include forming a contact hole which is formed through the first via insulating layer VIA1 to expose the first electrode SD1.

Figure 9:
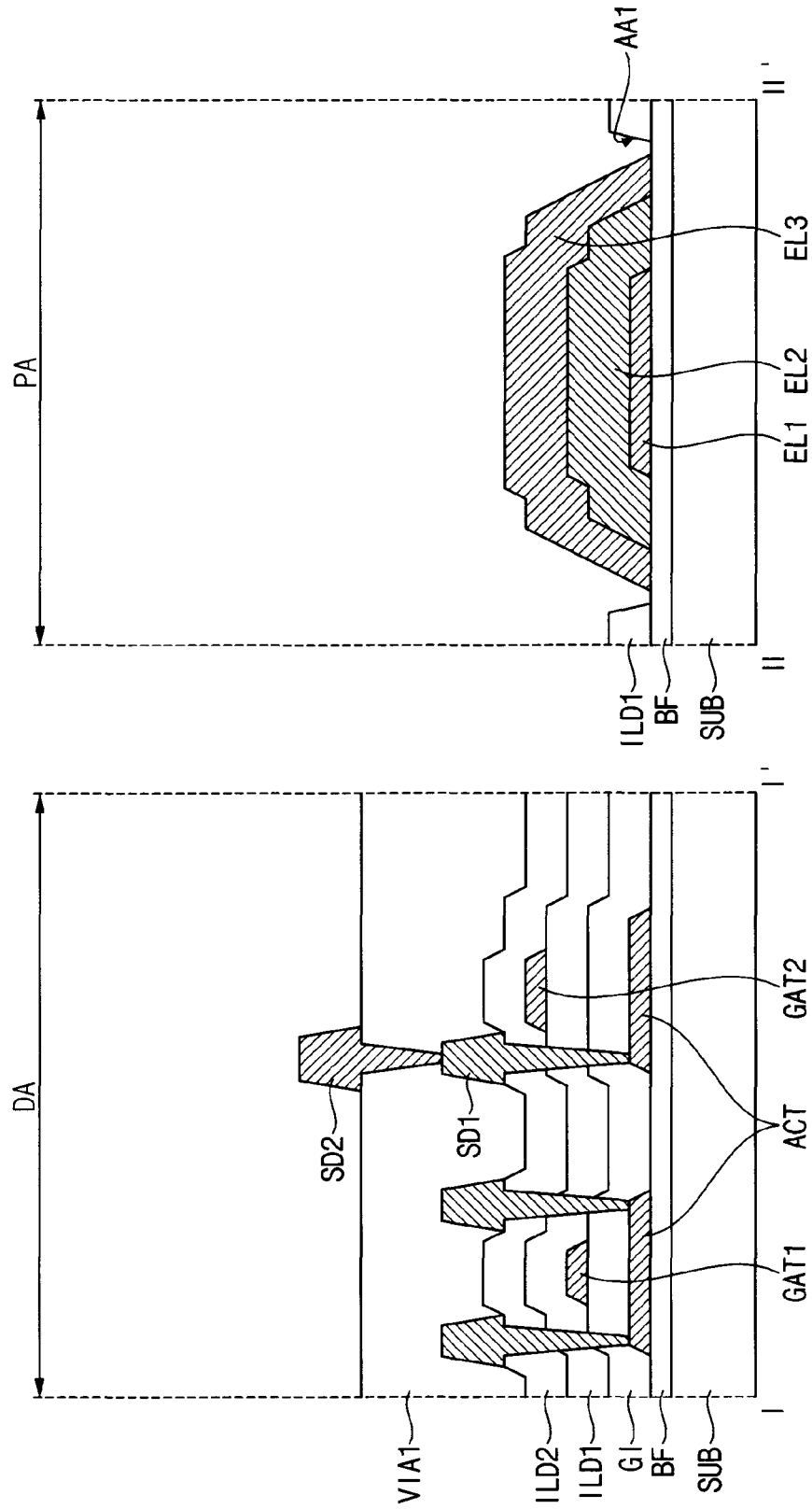

Referring to FIG. 9, the method of manufacturing the display device 10 may include forming the second electrode SD2 and the pad electrode EL3. The second electrode SD2 may be formed in the contact hole in the display area DA and disposed on the first via insulating layer VIA1 to make contact with the first electrode SD1 through the contact hole. The pad electrode EL3 may be disposed on the connection electrode EL2 in the pad area PA. The second electrode SD2 and the pad electrode EL3 may be simultaneously formed and may include the same material.

Figure 10:
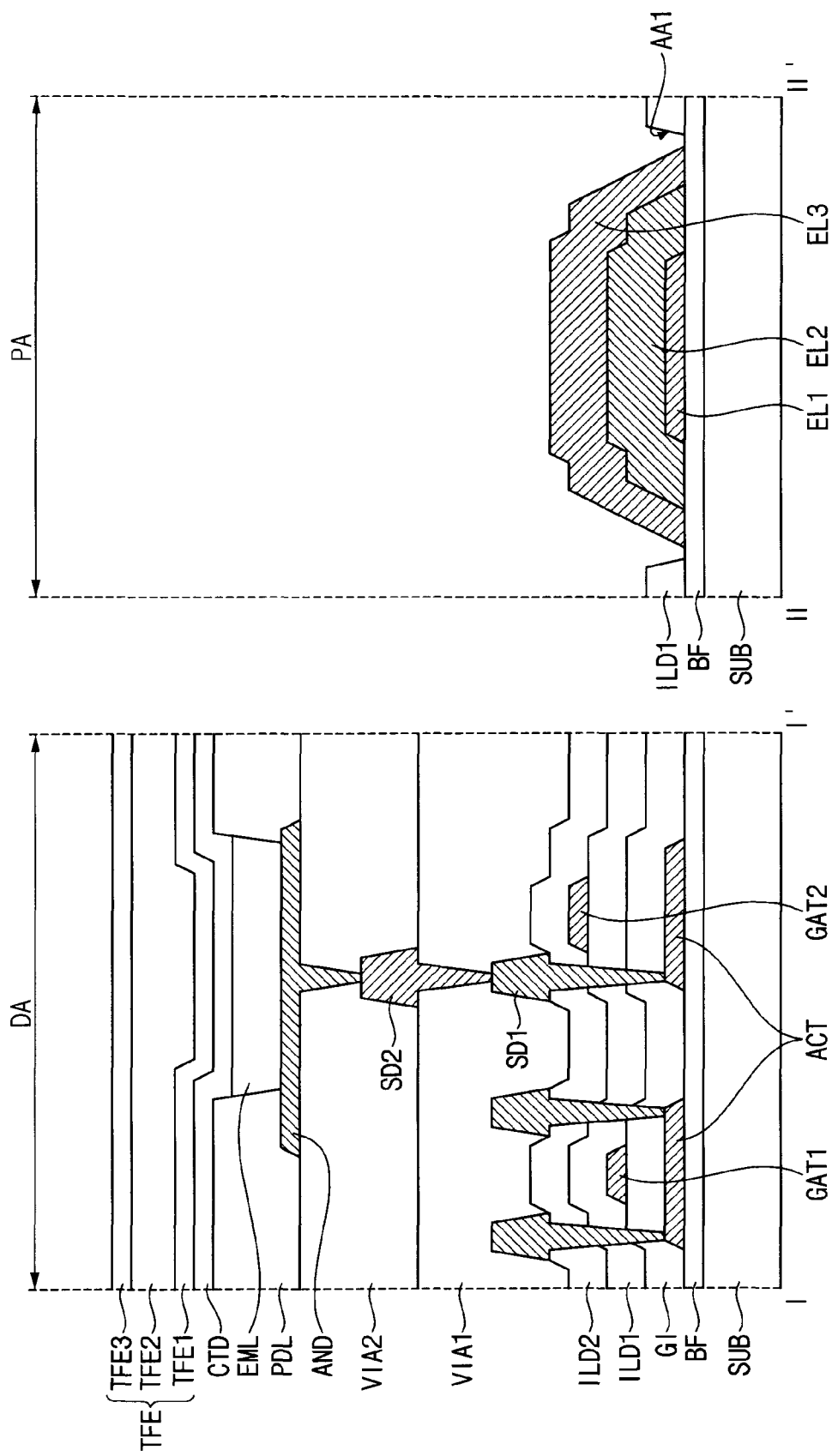

Referring to FIG. 10, the method of manufacturing the display device 10 may include forming the second via insulating layer VIA2, forming a contact hole which is formed through the second via insulating layer VIA2 to expose the second electrode SD2, forming the lower electrode layer AND, forming the pixel defining layer PDL, forming the light emission layer EML, forming the upper electrode layer CTD, and forming the encapsulation layer TFE in the display area DA.

Referring to FIG. 11, the method of manufacturing the display device 10 may include forming the first touch insulating layer YILD and forming the touch electrode YMTL1 in the display area DA. The first touch insulating layer YILD may be disposed on the encapsulation layer TFE, and the touch electrode YMTL1 may be disposed on the first touch insulating layer YILD.

Figure 12:
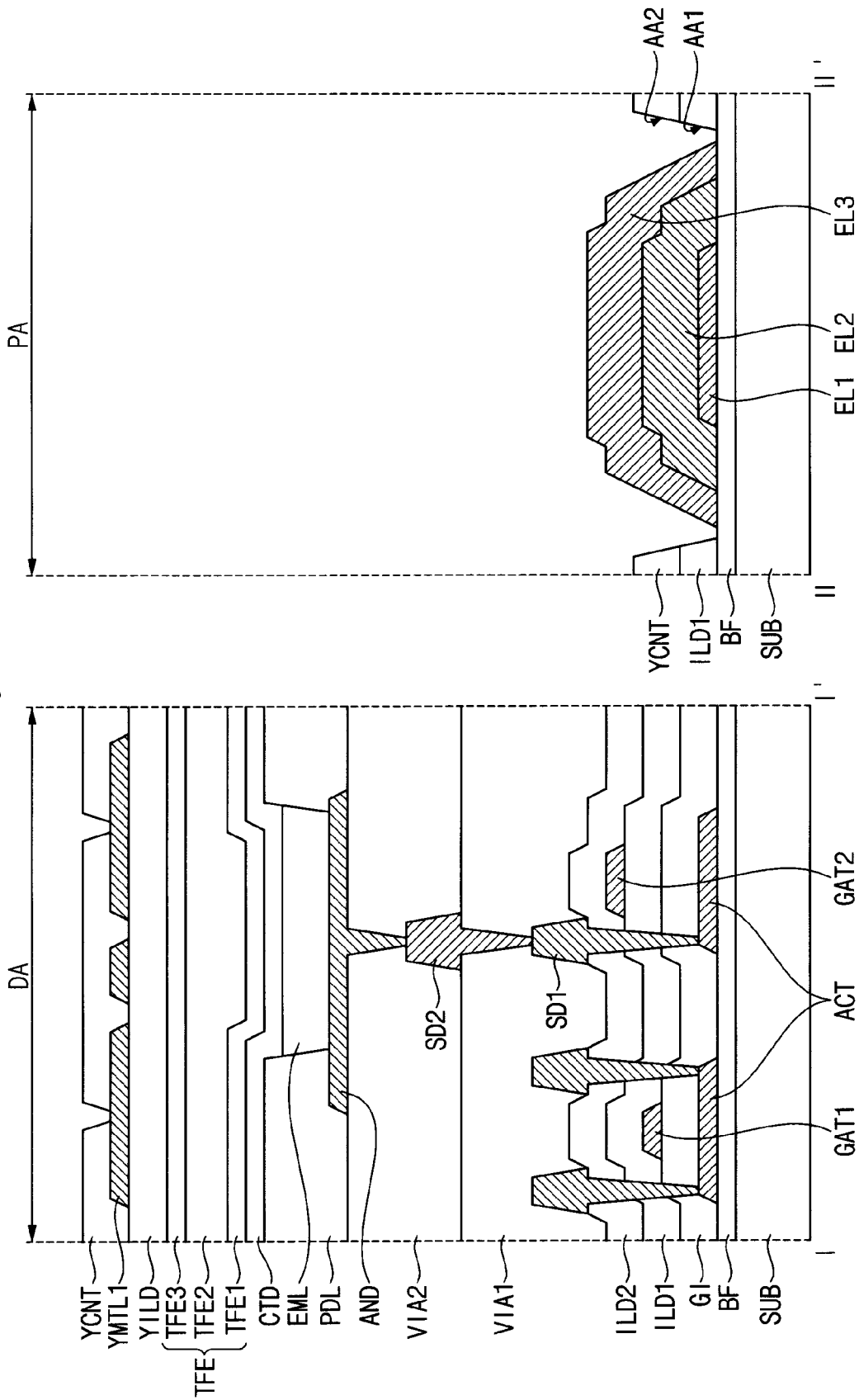

Referring to FIG. 12, the method of manufacturing the display device 10 may include forming the second touch insulating layer YCNT. The second touch insulating layer YCNT may be disposed on the touch electrode YMTL1 in the display area DA and may extend from the display area DA to the pad area PA. The second touch insulating layer YCNT may be configured to have the second opening AA2 in the pad area PA. Although the insulating layer having the second opening AA2 is illustrated as the second touch insulating layer YCNT, the insulating layer having the second opening AA2 may be the first touch insulating layer YILD. In other words, the first touch insulating layer YILD may extend from the display area DA to the pad area PA and may have the second opening AA2 in the pad area PA.

Then, the method may include forming a contact hole which is formed through the second touch insulating layer YCNT to expose the touch electrode YMTL1.

Referring to FIG. 13, the method of manufacturing the display device 10 may include forming the connection conductive layer YMTL2 and the cover electrode EL4. The connection conductive layer YMTL2 may be formed in the contact hole in the display area DA and disposed on the second touch insulating layer YCNT to make contact with the touch electrode YMTL1 through the contact hole. The cover electrode EL4 may be disposed on the pad electrode EL3 in the pad area PA. The connection conductive layer YMTL2 and the cover electrode EL4 may be simultaneously formed and may include the same material.

Figure 14:
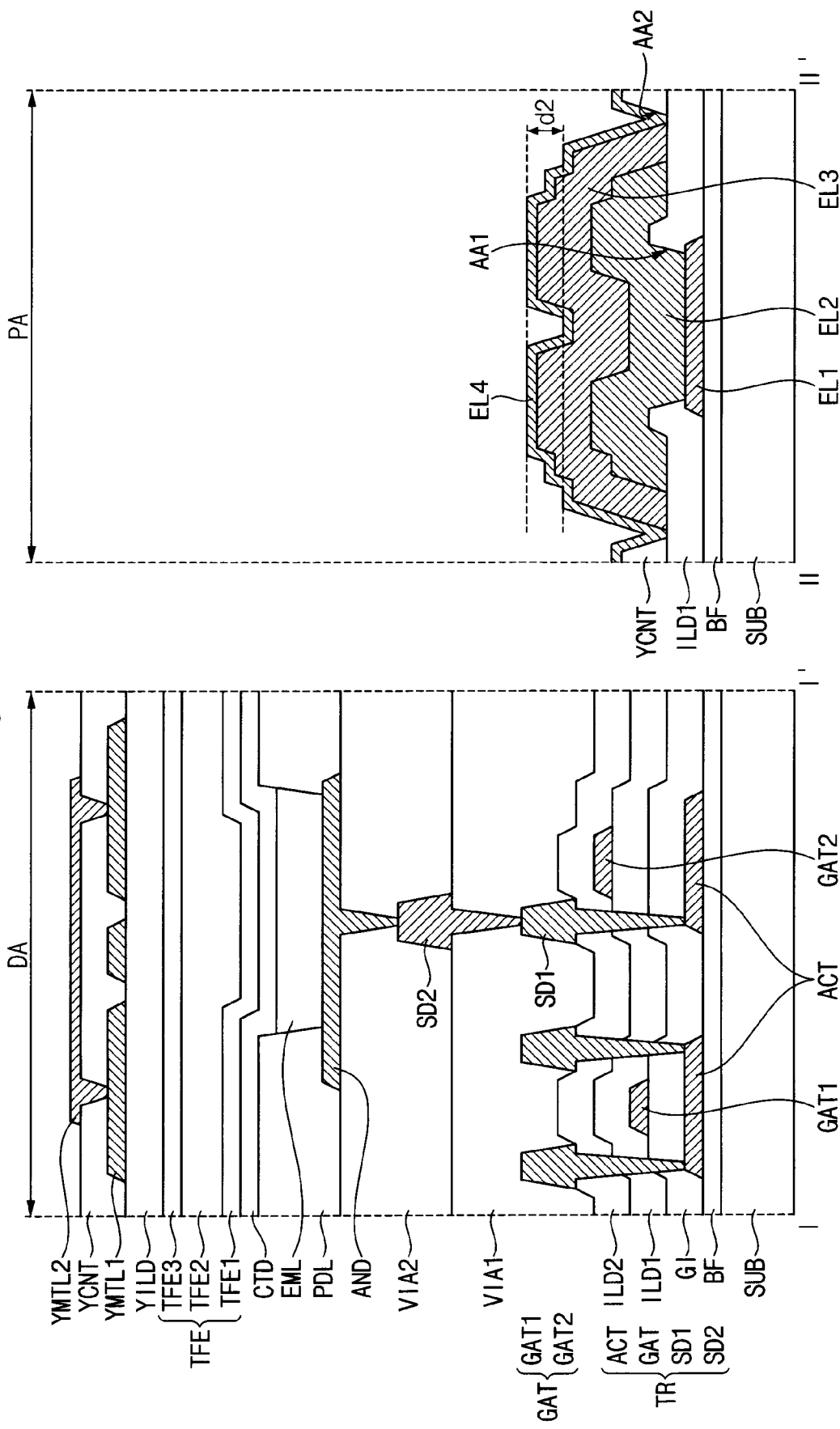
FIG. 14 is a cross-sectional view illustrating a display device according to an embodiment.

FIG. 14 is a cross-sectional view illustrating a display device 10 according to an embodiment.

Referring to FIG. 14, the first insulating layer ILD1 may extend from the display area DA to the pad area PA, and may have the first opening AA1 in the pad area PA. However, this is for illustrative purpose only, and at least one of the first insulating layer ILD1 and the second insulating layer ILD2 may extend from the display area DA to the pad area PA and may have the first opening AA1 in the pad area PA. In addition, when both the first insulating layer ILD1 and the second insulating layer ILD2 extend from the display area DA to the pad area PA and have openings in the pad area PA, the openings may overlap each other to define the first opening AA1.

The signal electrode EL1 may be disposed in the first opening AA1 in the substrate SUB. In more detail, the first insulating layer ILD1 having the first opening AA1 may cover the side surface of the signal electrode EL1, The signal electrode EL1 may include the same material as at least one of the first gate electrode GAT1 and the second gate electrode GAT2.

The connection electrode EL2 may be disposed on the signal electrode EL1. The connection electrode EL2 may be directly disposed on the signal electrode EL1. The connection electrode EL2 may come into contact with the upper surface of the signal electrode EL1 exposed through the first opening AA1. The connection electrode EL2 may not be electrically connected to the signal electrode EL1 through a contact hole, and the lower surface of the connection electrode EL2 may come into direct-contact with the upper surface of the signal electrode EL1. The connection electrode EL2 and the signal electrode EL1 may be electrically connected to each other. The connection electrode EL2 may include the same material as the first electrode SD1. The connection electrode EL2 may also be disposed on the first insulating layer ILD1 having the first opening AA1.

The pad electrode EL3 may be disposed on the connection electrode EL2. The pad electrode EL3 may be directly disposed on the connection electrode EL2. An insulating layer may not be disposed between the pad electrode EL3 and the connection electrode EL2. The pad electrode EL3 may not be electrically connected to the connection electrode EL2 through a contact hole, and the lower surface of the pad electrode EL3 may come into direct-contact with the upper surface and the side surface of the connection electrode EL2. The pad electrode EL3 and the connection electrode EL2 may be electrically connected to each other. The pad electrode EL3 may completely cover the upper surface and the side surface of the connection electrode EL2. Not only the pad electrode EL3 may cover the connection electrode EL2 when viewed in a sectional view, but also the pad electrode EL3 may completely cover the connection electrode EL2 when viewed in a plan view. The pad electrode EL3 may include the same material as the second electrode SD2. The pad electrode EL3 may be disposed on the first insulating layer ILD1 having the first opening AA1.

The second touch insulating layer YCNT may extend from the display area DA to the pad area PA and may have the second opening AA2 overlapping the first opening AA1 in the pad area PA. However, this is for illustrative purpose only, and at least one of the first touch insulating layer YILD and the second touch insulating layer YCNT may extend from the display area DA to the pad area PA, and may have the second opening AA2 overlapping the first opening AA1 in the pad area PA. When the first and second touch insulating layers YILD and YCNT extend from the display area DA to the pad area PA and have openings in the pad area PA, the openings may overlap each other to define the second opening AA2 overlapping the first opening AA1.

The second touch insulating layer YCNT having the second opening AA2 may be disposed as being spaced apart from the signal electrode EL1, the connection electrode EL2, and the pad electrode EL3. In more detail, the second touch insulating layer YCNT having the second opening AA2 may not make contact with the signal electrode EL1, the connection electrode EL2, and the pad electrode EL3, and may not cover the signal electrode EL1, the connection electrode EL2, and the pad electrode EL3.

The cover electrode EL4 may be disposed on the pad electrode EL3. The cover electrode EL4 may be directly disposed on the pad electrode EL3. An insulating layer may not be disposed between the cover electrode EL4 and the pad electrode EL3. The cover electrode EL4 may not be electrically connected to the pad electrode EL3 through a contact hole, and the lower surface of the cover electrode EL4 may come into direct-contact with the upper surface and the side surface of the pad electrode EL3. The cover electrode EL4 and the pad electrode EL3 may be electrically connected to each other. The cover electrode EL4 may completely cover the upper surface and the side surface of the pad electrode EL3. Not only the cover electrode EL4 may cover the pad electrode EL3 when viewed in a sectional view, but also the cover electrode EL4 may completely cover the pad electrode EL3 when viewed in a plan view. The cover electrode EL4 may include the same material as the connection conductive layer YMTL2.

The connection electrode EL2 may be directly disposed on the signal electrode EL1, the pad electrode EL3 may be directly disposed on the connection electrode EL2, and the cover electrode EL4 may be directly disposed on the pad electrode EL3, so that the step difference d2 of an electrode structure of each pad PD disposed on the pad area PA may be reduced. The first touch insulating layer YILD and the second touch insulating layer YCNT may be disposed as being spaced apart from the signal electrode EL1, the connection electrode EL2, and the pad electrode EL3, so that the step difference d2 of the electrode structure of each pad PD disposed in the pad area PA may be minimized. Since the step difference d2 of the electrode structure of each pad PD disposed on the pad area PA is reduced, the contact characteristics with respect to the conductive ball may be improved.

The cover electrode EL4 may cover the pad electrode EL3, the pad electrode EL3 may cover the connection electrode EL2, and the connection electrode EL2 and the first insulating layer ILD1 may cover the signal electrode EL1, so that the signal electrode EL1, the connection electrode EL2, and the pad electrode EL3 may be prevented from being corroded.

The contact characteristics with respect to the conductive ball may be improved by reducing the step difference of each pad PD disposed on the pad area PA while preventing the electrodes included in each pad PD from being corroded.

FIG. 15 is a cross-sectional view illustrating a display device 10 according to an embodiment.

Referring to FIG. 15, the first insulating layer ILD1 may extend from the display area DA to the pad area PA, and may have the first opening AA1 in the pad area PA. However, this is for illustrative purpose only, and at least one of the gate insulating layer GI, the first insulating layer ILD1, and the second insulating layer ILD2 may extend from the display area DA to the pad area PA, and may have the first opening AA1 in the pad area PA. When at least two of the gate insulating layer GI, the first insulating layer ILD1, and the second insulating layer ILD2 extend from the display area DA to the pad area PA and have openings in the pad area PA, the openings may overlap each other to define the first opening AA1.

The signal electrode EL1 may be disposed in the first opening AA1 in the substrate SUB. The first insulating layer ILD1 having the first opening AA1 may be disposed as being spaced apart from the signal electrode EL1. The first insulating layer ILD1 having the first opening AA1 may not come into contact with the signal electrode EL1, and may not cover the signal electrode EL1. The signal electrode EL1 may include the same material as at least one of the first gate electrode GAT1 and the second gate electrode GAT2.

The connection electrode EL2 may be disposed on the signal electrode EL1. The connection electrode EL2 may be directly disposed on the signal electrode EL1. An insulating layer may not be disposed between the connection electrode EL2 and the signal electrode EL1. The connection electrode EL2 may not be electrically connected to the signal electrode EL1 through a contact hole, and the lower surface of the connection electrode EL2 may come into direct-contact with the upper surface and the side surface of the signal electrode EL1. The connection electrode EL2 and the signal electrode EL1 may be electrically connected to each other. The connection electrode EL2 may completely cover the upper surface and the side surface of the signal electrode EL1. Not only the connection electrode EL2 may cover the signal electrode EL1 when viewed in a sectional view, but also the connection electrode EL2 may completely cover the signal electrode EL1 when viewed in a plan view. The connection electrode EL2 may include the same material as the first electrode SD1. The connection electrode EL2 may be disposed on the first insulating layer ILD1 having the first opening AA1.

The pad electrode EL3 may be disposed on the connection electrode EL2. The pad electrode EL3 may be directly disposed on the connection electrode EL2. An insulating layer may not be disposed between the pad electrode EL3 and the connection electrode EL2. The pad electrode EL3 may not be electrically connected to the connection electrode EL2 through a contact hole, and the lower surface of the pad electrode EL3 may come into direct-contact with the upper surface and the side surface of the connection electrode EL2. The pad electrode EL3 and the connection electrode EL2 may be electrically connected to each other. The pad electrode EL3 may include the same material as the second electrode SD2.

The first insulating layer ILD1 having the first opening AA1 may be disposed as being spaced apart from the pad electrode EL3. The first insulating layer ILD1 having the first opening AA1 may not come into contact with the pad electrode EL3, and may not cover the pad electrode EL3.

The second touch insulating layer YCNT may extend from the display area DA to the pad area PA and may have the second opening AA2 overlapping the first opening AA1 in the pad area PA. However, this is for illustrative purpose only, and at least one of the first touch insulating layer YILD and the second touch insulating layer YCNT may extend from the display area DA to the pad area PA, and may have the second opening AA2 overlapping the opening AA1 in the pad area PA. In addition, when the first and second touch insulating layers YILD and YCNT extend from the display area DA to the pad area PA and have openings in the pad area PA, the openings may overlap each other to define the second opening AA2 overlapping the first opening AA1.

The cover electrode EL4 may be disposed on the pad electrode EL3. The cover electrode EL4 may be directly disposed on the pad electrode EL3. The cover electrode EL4 may come into contact with the upper surface of the pad electrode EL3 exposed through the second opening AA2. The cover electrode EL4 may not be electrically connected to the pad electrode EL3 through a contact hole, and the lower surface of the cover electrode EL4 may come into direct-contact with the upper surface of the pad electrode EL3. The cover electrode EL4 and the pad electrode EL3 may be electrically connected to each other. The cover electrode EL4 may include the same material as the connection conductive layer YMTL2. The cover electrode EL4 may also be disposed on the second touch insulating layer YCNT having the second opening AA2.

The connection electrode EL2 may be directly disposed on the signal electrode EL1, the pad electrode EL3 may be directly disposed on the connection electrode EL2, and the cover electrode EL4 may be directly disposed on the pad electrode EL3, so that the step difference d3 of an electrode structure of each pad PD disposed on the pad area PA may be reduced. The gate insulating layer GI, the first insulating layer ILD1, and the second insulating layer ILD2 may be disposed as being spaced apart from the signal electrode EL1, so that the step difference d3 of the electrode structure of each pad PD disposed on the pad area PA may be minimized. Since the step difference d3 of the electrode structure of each pad PD disposed on the pad area PA is reduced, the contact characteristic with respect to the conductive ball may be improved.

The cover electrode EL4 and the second touch insulating layer YCNT may cover the pad electrode EL3, the pad electrode EL3 and the second touch insulating layer YCNT may cover the connection electrode EL2, and the connection electrode EL2 may cover the signal electrode EL1, so that the signal electrode EL1, the connection electrode EL2, and the pad electrode EL3 may be prevented from being corroded.

The contact characteristics with respect to the conductive ball may be improved by reducing the step difference of each PD disposed on the pad area PA while preventing the electrodes included in each pad PD from being corroded.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate including a display area and a pad area;
   a pixel structure disposed on the display area;
   a pixel insulating layer disposed on the pad area and having a first opening; and
   a pad electrode structure including a signal electrode disposed in the first opening, a connection electrode disposed on the signal electrode, and a pad electrode disposed on the connection electrode,
   wherein an upper surface and a side surface of the signal electrode come into direct-contact with a lower surface of the connection electrode, and
   an upper surface and a side surface of the connection electrode come into direct-contact with a lower surface of the pad electrode,
   wherein the connection electrode completely covers the upper surface and the side surface of the signal electrode.

2. The display device of claim 1, wherein the pixel insulating layer is spaced apart from the signal electrode, the connection electrode, and the pad electrode.

3. The display device of claim 1, wherein the pad electrode completely covers the upper surface and the side surface of the connection electrode.

4. The display device of claim 1, further comprising a transistor disposed on the display area between the substrate and the pixel structure,
   wherein the transistor includes:
      an active pattern;
      a gate electrode disposed on the active pattern;
      a first electrode disposed on the gate electrode; and
      a second electrode disposed on the first electrode.

5. The display device of claim 4, wherein the signal electrode includes a material identical to a material of the gate electrode.

6. The display device of claim 4, wherein the connection electrode includes a material identical to a material of the first electrode.

7. The display device of claim 4, wherein the pad electrode includes a material identical to a material of the second electrode.

8. The display device of claim 4, wherein the pixel insulating layer includes:
   a gate insulating layer that covers the active pattern in the display area and has an opening in the pad area; and
   an interlayer insulating layer that covers the gate electrode in the display area and has an opening overlapping the opening of the gate insulating layer in the pad area, and
   wherein the opening of the gate insulating layer and the opening of the interlayer insulating layer are defined as a first opening of the pixel insulating layer.

9. A display device comprising:
   a substrate including a display area and a pad area;
   a pixel structure disposed on the display area;
   a pixel insulating layer disposed on the pad area and having a first opening; and
   a pad electrode structure including a signal electrode disposed in the first opening, a connection electrode disposed on the signal electrode, and a pad electrode disposed on the connection electrode,
   wherein an upper surface and a side surface of the signal electrode come into direct-contact with a lower surface of the connection electrode, and
   an upper surface and a side surface of the connection electrode come into direct-contact with a lower surface of the pad electrode,
   an encapsulation layer disposed on the display area in the pixel structure; and
   a touch structure disposed on the encapsulation layer,
   wherein the touch structure includes:
      a touch electrode;
      a touch insulating layer disposed on the touch electrode, extending from the display area to the pad area on the encapsulation layer, and having a second opening overlapping the first opening in the pad area; and a connection conductive layer disposed on the display area in the touch insulating layer.

10. The display device of claim 9, wherein the touch insulating layer is spaced apart from the signal electrode, the connection electrode, and the pad electrode.

11. The display device of claim 9, further comprising:
a cover electrode disposed on the pad electrode,
wherein an upper surface and a side surface of the pad electrode come into direct-contact with a lower surface of the cover electrode.

12. The display device of claim 11, wherein the cover electrode completely covers the upper surface and the side surface of the pad electrode.

13. The display device of claim 11, wherein the cover electrode includes a material identical to a material of the connection conductive layer.

14. A display device comprising:
a substrate including a display area and a pad area;
a first gate electrode disposed in the display area;
a first insulating layer covering the first gate electrode;
a second gate electrode disposed on the first insulating layer;
a second insulating layer covering the second gate electrode;
a first electrode disposed on the second insulating layer;
a second electrode disposed on the first electrode;
a pixel structure disposed on the second electrode;
an encapsulation layer disposed on the pixel structure;
a first touch insulating layer covering the encapsulation layer;
a touch electrode disposed on the first touch insulating layer;
a second touch insulating layer covering the touch electrode;
a connection conductive layer disposed on the second touch insulating layer and coming into contact with the touch electrode;
a signal electrode disposed on the substrate in the pad area;
a connection electrode directly disposed on the signal electrode;
a pad electrode directly disposed on the connection electrode; and
a cover electrode directly disposed on the pad electrode.

15. The display device of claim 14, wherein at least one of the first insulating layer and the second insulating layer extends from the display area to the pad area and has a first opening in the pad area, and the signal electrode is disposed in the first opening.

16. The display device of claim 15, wherein at least one of the first touch insulating layer and the second touch insulating layer extends from the display area to the pad area and has a second opening overlapping the first opening in the pad area.

17. The display device of claim 16, wherein at least one of the first insulating layer and the second insulating layer, which has the first opening, is spaced apart from the signal electrode, the connection electrode, and the pad electrode.

18. The display device of claim 16, wherein at least one of the first touch insulating layer and the second touch insulating layer, which has the second opening, is spaced apart from the signal electrode, the connection electrode, and the pad electrode.

19. The display device of claim 16, wherein the signal electrode includes a material identical to a material of the first gate electrode or the second gate electrode,
the connection electrode includes a material identical to a material of the first electrode,
the pad electrode includes a material identical to a material of the second electrode, and
the cover electrode includes a material identical to a material of the connection conductive layer, and covers the second opening.

* * * * *